(12) United States Patent
Do et al.

(10) Patent No.: US 10,573,643 B2
(45) Date of Patent: Feb. 25, 2020

(54) INTEGRATED CIRCUIT HAVING VERTICAL TRANSISTOR AND SEMICONDUCTOR DEVICE INCLUDING THE INTEGRATED CIRCUIT

(71) Applicant: Samsung Electronics Co., Ltd., Suwon-si, Gyeonggi-do (KR)

(72) Inventors: Jung-ho Do, Hwaseong-si (KR); Sang-hoon Baek, Seoul (KR); Tae-joong Song, Seongnam-si (KR); Jong-hoon Jung, Seongnam-si (KR); Seung-young Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/686,795

(22) Filed: Aug. 25, 2017

(65) Prior Publication Data
US 2018/0175024 A1  Jun. 21, 2018

(30) Foreign Application Priority Data
Dec. 15, 2016  (KR) .................. 10-2016-0171669

(51) Int. Cl.
| | | |
|---|---|---|
| *H01L 27/088* | (2006.01) | |
| *H01L 23/528* | (2006.01) | |
| *H01L 29/78* | (2006.01) | |
| *H01L 27/07* | (2006.01) | |
| *H01L 27/02* | (2006.01) | |
| *H01L 29/417* | (2006.01) | |
| *H01L 23/522* | (2006.01) | |
| *H01L 29/08* | (2006.01) | |
| *H01L 29/10* | (2006.01) | |

(52) U.S. Cl.
CPC .......... *H01L 27/088* (2013.01); *H01L 23/528* (2013.01); *H01L 23/5226* (2013.01); *H01L 27/0207* (2013.01); *H01L 27/0705* (2013.01); *H01L 29/41741* (2013.01); *H01L 29/7827* (2013.01); *H01L 29/0847* (2013.01); *H01L 29/1037* (2013.01)

(58) Field of Classification Search
CPC ............... H01L 27/088; H01L 23/5226; H01L 29/41741; H01L 27/0705; H01L 29/7827; H01L 23/528; H01L 27/0207; H01L 29/1037; H01L 29/0847
See application file for complete search history.

(56) References Cited

U.S. PATENT DOCUMENTS

| | | |
|---|---|---|
| 6,449,186 B2 | 9/2002 | Noble |
| 7,138,685 B2 | 11/2006 | Hsu et al. |

(Continued)

*Primary Examiner* — Bitew A Dinke
(74) *Attorney, Agent, or Firm* — Harness, Dickey & Pierce, P.L.C.

(57) ABSTRACT

An integrated circuit having a vertical transistor includes first through fourth gate lines extending in a first direction and sequentially arranged in parallel with each other, a first top active region over the first through third gate lines and insulated from the second gate line, and a second top active region. The first top active region forms first and third transistors with the first and third gate lines respectively. The second top active region is over the second through fourth gate lines and insulated from the third gate line. The second top active region forms second and fourth transistors with the second and fourth gate lines respectively.

11 Claims, 29 Drawing Sheets

(56) References Cited

U.S. PATENT DOCUMENTS

| | | |
|---|---|---|
| 7,989,866 B2 | 8/2011 | Abbott et al. |
| 8,030,689 B2 | 10/2011 | Becker et al. |
| 8,129,753 B2 | 3/2012 | Becker et al. |
| 8,217,428 B2 | 7/2012 | Becker et al. |
| 8,258,547 B2 | 9/2012 | Becker et al. |
| 8,258,550 B2 | 9/2012 | Becker et al. |
| 8,258,552 B2 | 9/2012 | Becker et al. |
| 8,264,044 B2 | 9/2012 | Becker |
| 8,264,049 B2 | 9/2012 | Becker |
| 8,581,348 B2 | 11/2013 | Rashed et al. |
| 8,679,911 B2 | 3/2014 | Wang et al. |
| 8,729,606 B2 | 5/2014 | Becker et al. |
| 8,735,944 B2 | 5/2014 | Becker et al. |
| 8,755,219 B2 | 6/2014 | Masuoka et al. |
| 8,853,794 B2 | 10/2014 | Becker et al. |
| 8,883,594 B2 | 11/2014 | Chuang et al. |
| 8,969,949 B2 | 3/2015 | Chuang et al. |
| 9,431,491 B2 | 8/2016 | Aoki et al. |
| 9,680,473 B1* | 6/2017 | Anderson ............ H01L 27/0207 |
| 9,859,898 B1* | 1/2018 | Anderson ........ H03K 19/17796 |
| 2002/0000592 A1* | 1/2002 | Fujiwara ............... H01L 27/115 |
| | | 257/296 |
| 2005/0253143 A1* | 11/2005 | Takaura .............. H01L 27/0688 |
| | | 257/67 |
| 2006/0136848 A1* | 6/2006 | Ichiryu ............... G06F 17/5072 |
| | | 716/120 |
| 2008/0211028 A1* | 9/2008 | Suzuki ............ H01L 21/823425 |
| | | 257/360 |
| 2010/0187615 A1* | 7/2010 | Becker ................ H01L 27/0207 |
| | | 257/369 |
| 2010/0224924 A1* | 9/2010 | Ellis ...................... H01L 27/108 |
| | | 257/300 |
| 2010/0277202 A1* | 11/2010 | Becker ................ H03K 19/215 |
| | | 326/54 |
| 2011/0221067 A1* | 9/2011 | Ikegami .............. H01L 27/0207 |
| | | 257/773 |
| 2011/0278681 A1* | 11/2011 | Smayling .......... H01L 21/76897 |
| | | 257/401 |
| 2013/0207199 A1* | 8/2013 | Becker .................. H01L 27/092 |
| | | 257/369 |
| 2014/0027918 A1 | 1/2014 | Rashed et al. |
| 2014/0110768 A1* | 4/2014 | Lin ..................... H01L 23/4824 |
| | | 257/288 |
| 2015/0171032 A1 | 6/2015 | Colinge et al. |
| 2015/0303270 A1 | 10/2015 | Liaw |
| 2015/0364333 A1 | 12/2015 | Chen et al. |
| 2015/0370950 A1* | 12/2015 | Kawa ................... G06F 17/5072 |
| | | 716/119 |
| 2015/0380548 A1 | 12/2015 | Wang et al. |
| 2016/0064541 A1 | 3/2016 | Diaz et al. |
| 2016/0078922 A1* | 3/2016 | Liaw .................. H01L 29/66666 |
| | | 365/51 |
| 2016/0079276 A1 | 3/2016 | Becker et al. |
| 2016/0086947 A1* | 3/2016 | Park ..................... H01L 27/092 |
| | | 257/369 |
| 2016/0118487 A1 | 4/2016 | Doornbos et al. |
| 2016/0204215 A1 | 7/2016 | Chang et al. |
| 2016/0300839 A1* | 10/2016 | Kim ..................... H01L 27/0924 |
| 2017/0077175 A1* | 3/2017 | Ueda .................... H01L 27/228 |
| 2018/0122793 A1* | 5/2018 | Moroz ................ H01L 29/4238 |

* cited by examiner

INTEGRATED CIRCUIT HAVING VERTICAL TRANSISTOR AND SEMICONDUCTOR DEVICE INCLUDING THE INTEGRATED CIRCUIT

CROSS-REFERENCE TO RELATED APPLICATION

This application claims the benefit of Korean Patent Application No. 10-2016-0171669, filed on Dec. 15, 2016, in the Korean Intellectual Property Office, the disclosure of which is incorporated herein in its entirety by reference.

BACKGROUND

Inventive concepts relate to an integrated circuit, and more particularly, to an integrated circuit having a vertical transistor and a semiconductor device including the integrated circuit.

A vertical transistor is a transistor that includes a channel through which charges pass between two electrodes of the transistor in a stacking direction. For example, in a vertical field-effect transistor (VFET), a source/drain region, a channel region, and a source/drain region may be stacked on one another in the given order and a gate electrode may surround the channel region at a level between the source region and the drain region. That is, the channel region may be formed to vertically penetrate the gate electrode. Such a vertical transistor may have different structures and different features from a planar transistor. Thus an integrated circuit including a vertical transistor needs to be designed differently from an, integrated circuit including a planar transistor.

SUMMARY

Inventive concepts relate to an integrated circuit having a vertical transistor, and more particularly, an integrated circuit having a layout designed in consideration of a structure of a vertical transistor and a semiconductor device including the integrated circuit.

According to some example embodiments of inventive concepts, an integrated circuit having a vertical transistor may include a first gate line, a second gate line, a third gate line, and a fourth gate line extending in a first direction and sequentially arranged in parallel with each other; a first top active region over the first gate line through the third gate line and insulated from the second gate line, the first top active region forming a first transistor and a third transistor with the first gate line and the third gate line respectively; and a second top active region over the second gate line through the fourth gate line and insulated from the third gate line, the second top active region forming a second transistor and a fourth transistor with the second gate line and the fourth gate line respectively.

According to some example embodiments of inventive concepts, an integrated circuit having a vertical transistor may include: a first partial gate line and a second partial gate line extending in a first direction and arranged in parallel with each other; a third partial gate line and a fourth partial gate line extending in alignment with the first partial gate line and the second partial gate line in the first direction, respectively, and arranged in parallel with each other; a first top active region and a second top active region respectively forming a first transistor and a second transistor with the first partial gate line and the second partial gate line; a third top active region and a fourth top active region respectively forming a third transistor and a fourth transistor with the third partial gate line and the fourth partial gate line; and a first bottom active region shared by the first transistor through the fourth transistor; a first connection structure connecting the first partial gate line and the fourth partial gate line; and a second connection structure intersecting the first connection structure, the second connection structure connecting the second partial gate line and the third partial gate line to each other.

According to some example embodiments of inventive concepts, an integrated circuit having a vertical transistor including: first and second partial gate lines extending in a first direction and arranged in parallel with each other; third and fourth partial gate lines extending in alignment with the first and second partial gate lines in the first direction, respectively, and arranged in parallel with each other; first and second top active regions respectively forming first and second transistors with the first and second partial gate lines; third and fourth top active regions respectively forming third and fourth transistors with the third and fourth partial gate lines; and a first bottom active region under the first and fourth partial gate lines and through which charges traveling between the first and fourth partial gate lines pass, wherein a connection between the first and fourth partial gate lines and a connection between the second and third gate lines that intersect each other.

According to some example embodiments, an integrated circuit having a vertical transistor may include a first partial gate line and a second partial gate line extending in a first direction and arranged in parallel with each other; a third partial gate line and a fourth partial gate line extending in alignment with the first partial gate line and the second partial gate line in the first direction, respectively, and arranged in parallel with each other; a first top active region and a second top active region respectively forming a first transistor and a second transistor with the first partial gate line and the second partial gate line; a third top active region and a fourth top active region respectively forming a third transistor and a fourth transistor with the third partial gate line and the fourth partial gate line; a first bottom active region under the first partial gate line and the fourth partial gate line; a first connection structure connecting the first partial gate line and the fourth partial gate line; and a second connection structure intersecting the first connection structure. The second connection structure may connect the second gate line and the third gate line. The first bottom active region may be configured to pass charges traveling between the first partial gate line and fourth partial gate line.

BRIEF DESCRIPTION OF THE DRAWINGS

Inventive concepts will be more clearly understood from the following detailed description taken in conjunction with the accompanying drawings in which.

DETAILED DESCRIPTION

Figure 1:
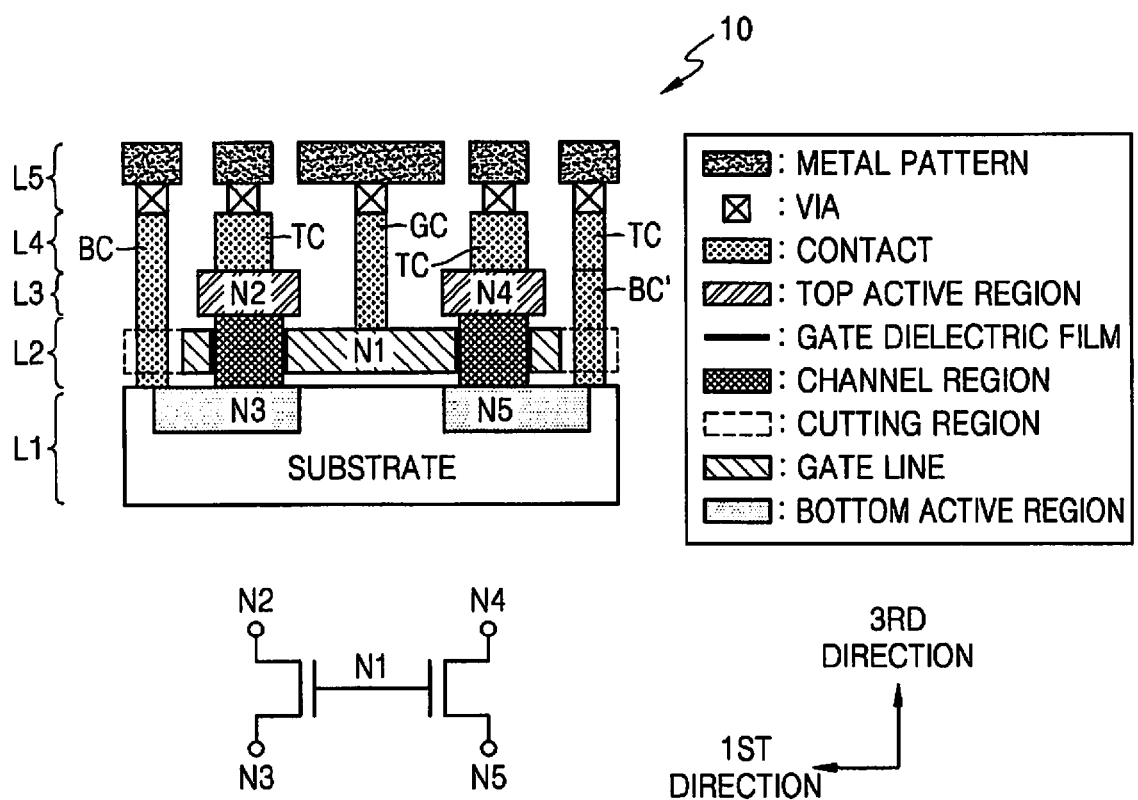
FIG. 1 is a cross-sectional view and a circuit diagram of an integrated circuit according to some example embodiments of inventive concepts.

FIG. 1 is a cross-sectional view and a circuit diagram of an integrated circuit 10 according to some example embodiments of inventive concepts. In more detail, as illustrated in FIG. 1, the integrated circuit 10 may include two transistors, wherein each of the two transistors may be a vertical transistor.

Referring to FIG. 1, the integrated circuit 10 may also include five layers L1 through L5 sequentially stacked in a third direction. As illustrated in FIG. 1, a first layer L1 may include a substrate and a bottom active region, and a second layer L2 may include a gate line, a channel region, and a gate dielectric layer. A third layer L3 may include a top active region, and a fourth layer L4 may include a contact. A fifth layer L5 may include a via and a metal pattern.

The contact may electrically connect the bottom active region, the gate line, and the top active region to the via. For example, as illustrated in FIG. 1, a bottom contact BC may electrically connect the bottom active region to the via, a top contact TC may electrically connect the top active region to the via, and a gate contact GC may electrically connect the gate line to the via. Also, the bottom active region and the gate line may be electrically connected to the via through two or more contacts. For example, as illustrated in FIG. 1, the bottom active region may be electrically connected to the via through a bottom contact BC' formed in the second and third layers L2 and L3 and the top contact TC stacked on the bottom contact BC' in the third direction. Each region of the integrated circuit 10 may be electrically connected to the via to receive or emit charges through a metal pattern or the like.

The integrated circuit 10 having a vertical transistor may need a space to electrically connect the bottom active region to the via. Referring to FIG. 1, since the channel region, the gate line, the top active region, and the like are stacked on the bottom active region, a space for disposing the contact BC or BC' for electrically connecting the bottom active region to the via may be required. Due to a structure of a vertical transistor, vertical transistors may be arranged densely, and thus, securing a space for a contact contacting the bottom active region may be an important element in designing the integrated circuit 10 having a vertical transistor.

A vertical transistor may refer to a transistor that includes a channel through which charges pass between two electrodes of the transistor in a stacking direction. (or a vertical direction) (e.g., the third direction in FIG. 1), As an example of a vertical transistor, a vertical field-effect transistor (VFET) or a vertical tunneling field-effect transistor (VT-FET) may include or be formed by a bottom active region (or a bottom source/drain region), a channel region, and a top active region (or a top source/drain region) that are stacked on one another in the given order and superimposed in a stacking direction (e.g., the third direction in FIG. 1) and a gate line surrounding the channel region at a level between the source region and the drain region. In other words, the VFET may include a bottom active region, a gate line, and a top active region stacked in the given order and superimposed in a stacking direction (e.g., the third direction in FIG. 1) and a channel region penetrating the gate line and contacting the bottom active region and the top active region. A gate dielectric layer may be disposed between the channel region and the gate line to form a path of charges passing through the channel region or to block charges depending on a potential of the gate line. The channel region may also be referred to as a nanowire.

Hereinafter, some example embodiments of inventive concepts will be described with reference to the integrated circuit having the VFET as illustrated in FIG. 1, but are not limited thereto.

As illustrated in FIG. 1, a first node N1 may be formed as a gate line in the integrated circuit 10, and may be electrically connected to the via through the gate contact GC. A second node N2 and a fourth node N4 may each be formed as a top active region over a channel region and may be electrically connected to the via through the top contact TC. A third node N3 and a fifth node N5 may each be formed as a bottom active region under the channel region and may be electrically connected to the via through the bottom contact BC or BC' in a portion not overlap the channel region in the third direction. A structure of the vertical transistor illustrated in FIG. 1 may be different from that of a planar transistor described later with reference to FIG. 3. Thus, when the integrated circuit 10 having vertical transistors is designed by placing and routing transistors like in an integrated circuit having a planar transistor, the integrated circuit 10 may have an inefficient structure.

As described later below with reference to following drawings, an integrated circuit having a vertical transistor may be designed to have an efficient structure by being designed in consideration of a structure of the vertical transistor according to some example embodiments of inventive concepts. Thus, waste of space may be limited and/or prevented, routing may be facilitated, and design freedom may be improved. As a result, an integrated circuit with low cost and high performance may be designed.

Figure 2:
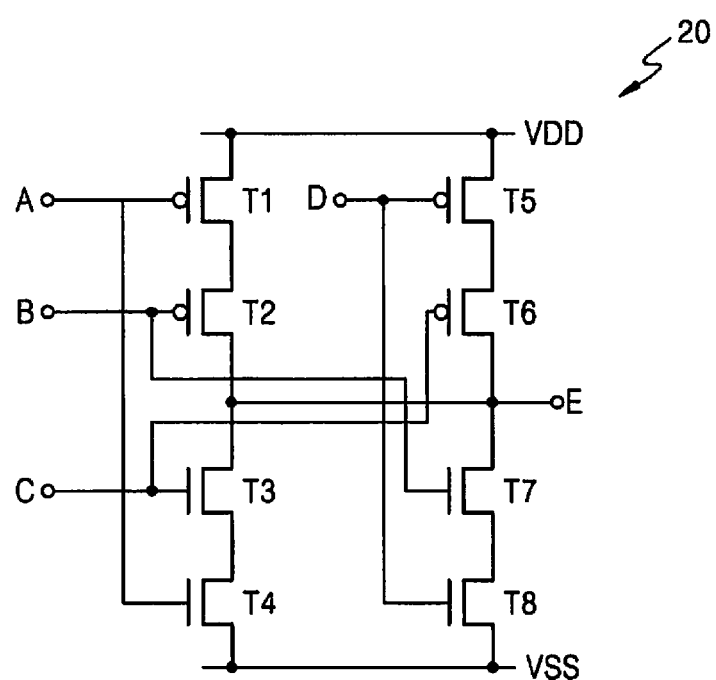
FIG. 2 is a partial circuit diagram of an integrated circuit according to some example embodiments of inventive concepts.

FIG. 2 is a partial circuit diagram of an integrated circuit 20 according to some example embodiments of inventive concepts. As illustrated in FIG. 2, the integrated circuit 20 may include a plurality of transistors TR1 through TR8 and each of the plurality of transistors TR1 through TR8 may be a metal-oxide-semiconductor field-effect transistor.

Referring to FIG. 2, each of three electrodes of a transistor, that is, a source, a drain, and a gate may be electrically interconnected with an electrode of another transistor. As described below with reference to FIGS. 3 and 4, such interconnections may be variously implemented in a layout of the integrated circuit 20. For example, gates of a first transistor TR1 and a fourth transistor TR4 may be electrically connected to each other via a gate line, as illustrated in FIG. 2. In the layout of the integrated circuit 20, a structure of the interconnections may be determined according to an arrangement of the transistors TR1 through TR8, and the arrangement of the transistors TR1 through TR8 may be determined according to the structure of the interconnections. Various layouts of an integrated circuit illustrated in the following drawings may correspond to the circuit diagram of the integrated circuit 20 of FIG. 2. That is, nodes A through E in FIG. 2 may coincide with nodes illustrated in the following drawings showing layouts. For convenience of illustration, reference numerals of power nodes VDD and VSS are not illustrated in the drawings showing layouts, and some interconnections for forming some nodes may be omitted.

Figure 3:
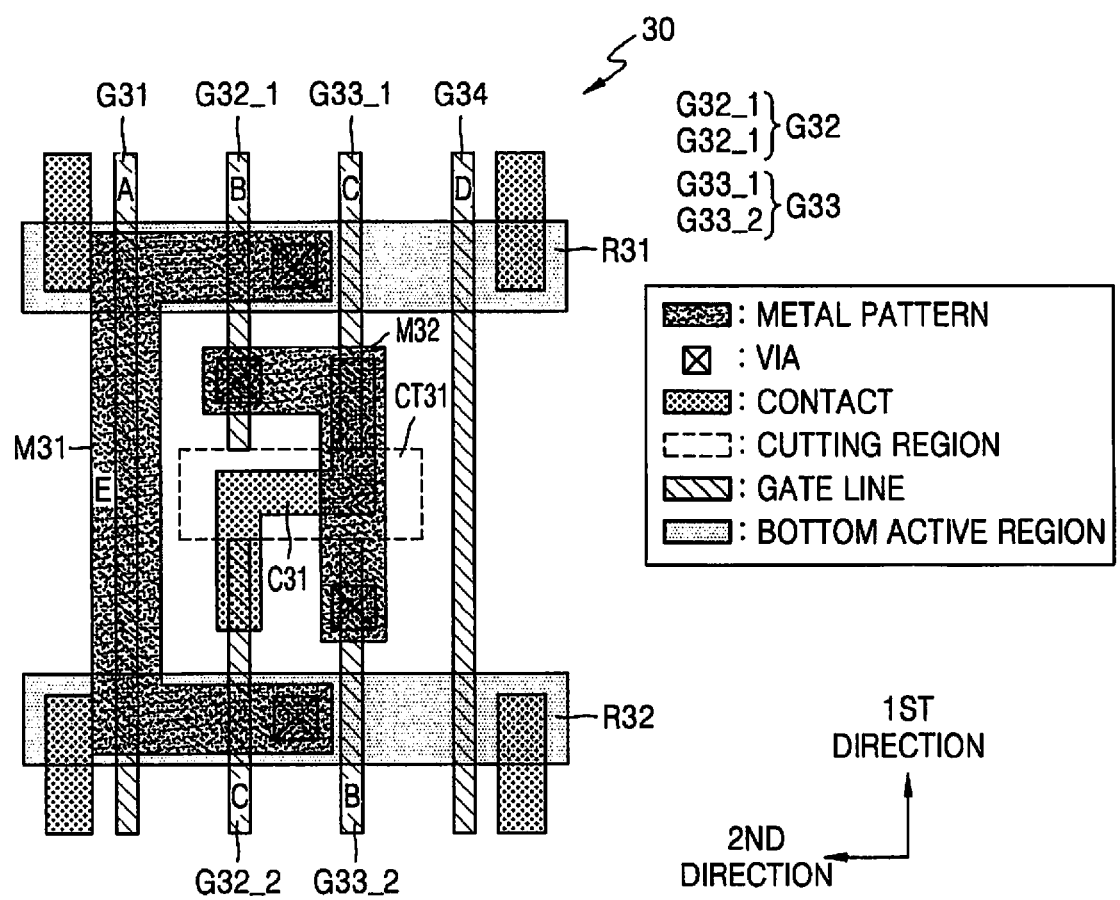
FIG. 3 is a plan view of a layout of an integrated circuit having a planar transistor, according to some example embodiments of inventive concepts.

FIG. 3 is a plan view of a layout of an integrated circuit 30 having a planar transistor, according to some example embodiments of inventive concepts. As illustrated in FIG. 3, the layout of the integrated circuit 30 may include two active regions R31 and R32 that are separated from each other and extend in a second direction and a plurality of gate lines G31 through G34 extending in parallel in a first direction.

Referring to FIG. 3, the transistors of the integrated circuit 20 of FIG. 2 may be implemented by using four continuously arranged gate lines G31 through G34. That is, each of the gate lines G31 to G34 may be used to form a transistor in a region overlapping the active regions R31 and R32. For example, the active regions R31 and R32 may be respectively doped to have different conductivity types, PMOS transistors may be formed by using the gate lines G31 through G34 overlapping the active region R31, and NMOS transistors may be formed by using the gate lines G31 through G34 overlapping the region R32.

Each of the first and fourth gate lines G31 and G34 may be used to integrally form a pair of PMOS transistor and NMOS transistor while the second and third gate lines G32 and G33 are separated from each other by a first cutting region CT31 including an insulator. For example, the second gate line G32 may be divided into two partial gate lines G32_1 and G32_2 by the first cutting region CT31, and the third gate line G33 may be divided into two partial gate lines G33_1 and G33_2 by the first cutting region CT31. Gates of transistors (e.g., TR2 and TR7) connected to the node B of FIG. 2 may be respectively formed by the partial gate line G32_1 of the second gate line G32 and the partial gate line G33_2 of the third gate line G33, and as illustrated in FIG. 3, the partial gate lines G32_1 and G33_2 may be electrically connected to each other through contacts, vias, and a second metal pattern M32. Similarly, gates of transistors (e.g., TR3 and TR6) connected to the node C of FIG. 2 may be respectively formed by the partial gate line G32_2 of the second gate line G32 and the partial gate line G33_1 of the third gate line G33, and as illustrated in FIG. 3, the partial gate lines G32_2 and G33_1 may be electrically connected to each other through a contact C31.

The same as with regard the second and third gate lines G32 and G33 of FIG. 3, the layout of the integrated circuit 30 may include a structure in which transistors (e.g., a pair of a PMOS transistor and an NMOS transistor) having gates connected to an identical node are formed by two adjacent gate lines or two gate lines having at least one gate located between the two gate lines instead of being formed by an integral gate line in the integrated circuit 30, and such a structure may be referred to as a cross-coupled structure (referred to as a cross-coupled construct). Transistors arranged and connected to one another according to the cross-coupled structure may be referred to as cross-coupled transistors. The cross-coupled structure may be generated from a plurality of logic circuits, such as flip-flops, multiplexers, latches, etc., and an area of the layout may be reduced due to the cross-coupled structure. As a result, integration density of the integrated circuit may be increased.

As illustrated in FIG. 3, due to the contact C31 and the second metal pattern M32 used to interconnect (or route) the cross-coupled transistors, a first metal pattern M31 may be formed to bypass the second metal pattern M32 as an interconnection to form the node E. That is, the cross-coupled structure may cause routing congestion, and thus there is a need to place transistors and route the placed transistors to reduce the routing congestion while having a reduced area. Referring to the following drawings, examples for effectively implementing a cross-coupled structure in a layout of an integrated circuit having a vertical transistor will be described according to some example embodiments of inventive concepts.

Figure 4A:
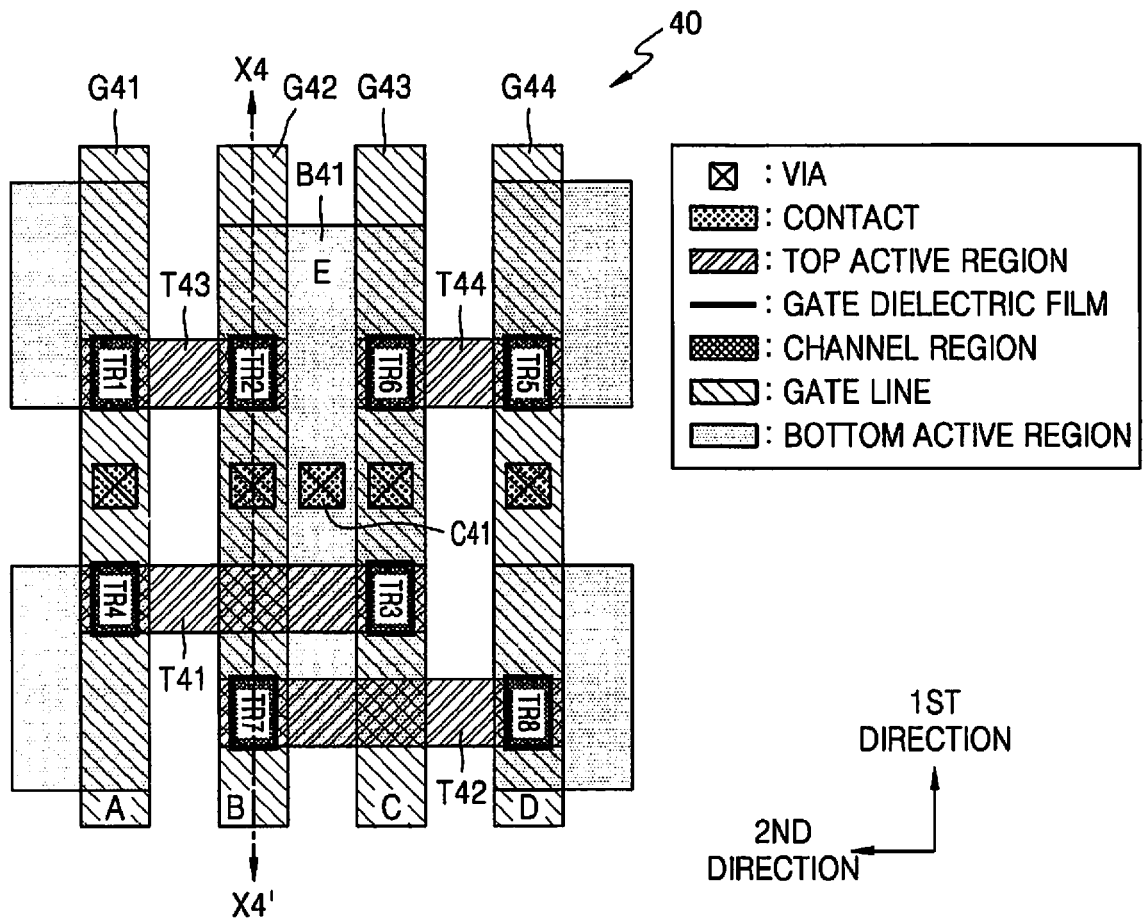
FIG. 4A is a plan view of a layout of an integrated circuit having a vertical transistor, according to some example embodiments of inventive concepts.
Figure 4B:
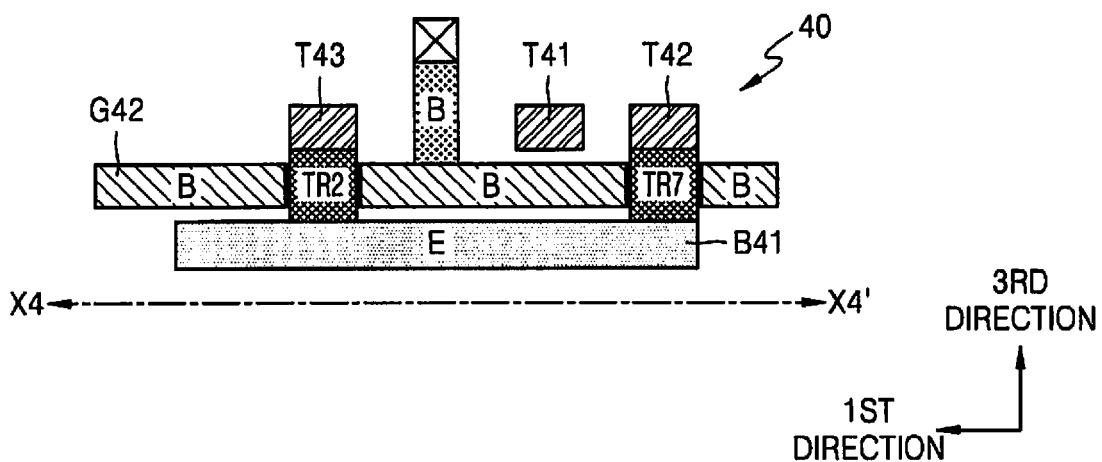
FIG. 4B is a cross-sectional view of the layout of FIG. 4A taken along line X4-X4'.

FIG. 4A is a plan view of a layout of an integrated circuit 40 having a vertical transistor, according to some example embodiments of inventive concepts, and FIG. 4B is a cross-sectional view of the layout of the integrated circuit 40 of FIG. 4A taken along line X4-X4'.

Referring to FIGS. 4A and 4B, the layout of the integrated circuit 40 may include first through fourth gate lines G41 through G44 extending in parallel in a first direction. The first through fourth gate lines G41 through G44 may form transistors in a region vertically overlapping top and bottom active regions (e.g., in a third direction of FIG. 4B). For example, a seventh transistor TR7 may be formed in a region where the second gate line G42, a first bottom active region B41, and a second top active region T42 are all vertically overlapped (e.g., in the third direction), by a channel region penetrating the second gate line G42 with a gate insulating film therebetween.

According to some example embodiments of inventive concepts, a cross-coupled structure may be formed by routing transistors using a top active region. For example, as illustrated in FIG. 4A, a first top active region T41 may be over the first through third gate lines G41 to G43, and the first top active region T41 may form the fourth and third transistors TR4 and TR3 with the first and third gate lines G41 and G43 respectively and may be insulated from the second gate line G42. That is, as illustrated in FIG. 4B, the first top active region T41 may be over the second gate line G42 due to a structure of the vertical transistor, and accordingly, may cross the second gate line G42 without interfering with the second gate line G42. Similarly, the second top active region T42 may be over the second through fourth gate lines G42 through G44, and the second and fourth gate lines G42 and G44 may respectively correspond to the seventh and eighth transistors TR7 and TR8 and may be insulated from the third gate line G43. Therefore, the third and fourth transistors TR3 and TR4 may be electrically connected to each other through the first top active region T41 and the seventh and eighth transistors TR7 and TR8 may be electrically connected to each other through the second top active region T42. In the layout of FIG. 4A, the contact C31 and the second metal pattern M32 included in the layout of FIG. 3 may be omitted to connect partial gate line pairs forming a connection which intersects with a connection of other partial gate line pairs.

The vertical transistors may share bottom active regions as well as top active regions. That is, as illustrated in FIG. 4A, the second, third, sixth, and seventh transistors TR2, TR3, TR6, and TR7 may share the first bottom active region B41 forming the node E. Accordingly, a contact or a metal pattern for connecting the second, third, sixth, and seventh transistors TR2, TR3, TR6, and TR7 to the node E may be omitted. As illustrated in FIG. 4A, the first bottom active region B41 may be electrically connected to a via through a first contact C41 disposed between the second and third gate lines G32 and G43. The first contact C41 may include the bottom contact BC of FIG. 1 and may include the bottom contact BC' and the top contact TC of FIG. 1 overlapping each other. The integrated circuit 40 may include a third top active region T43, which may form a first transistor TR1 with the first gate line G41 and a second transistor TR2 with the second gate line G42. The integrated circuit 40 may include a fourth top active region 144, which may form a fifth transistor TR5 with the fourth gate line G44 and a sixth transistor TR6 with the third gate line G43.

Figure 5A:
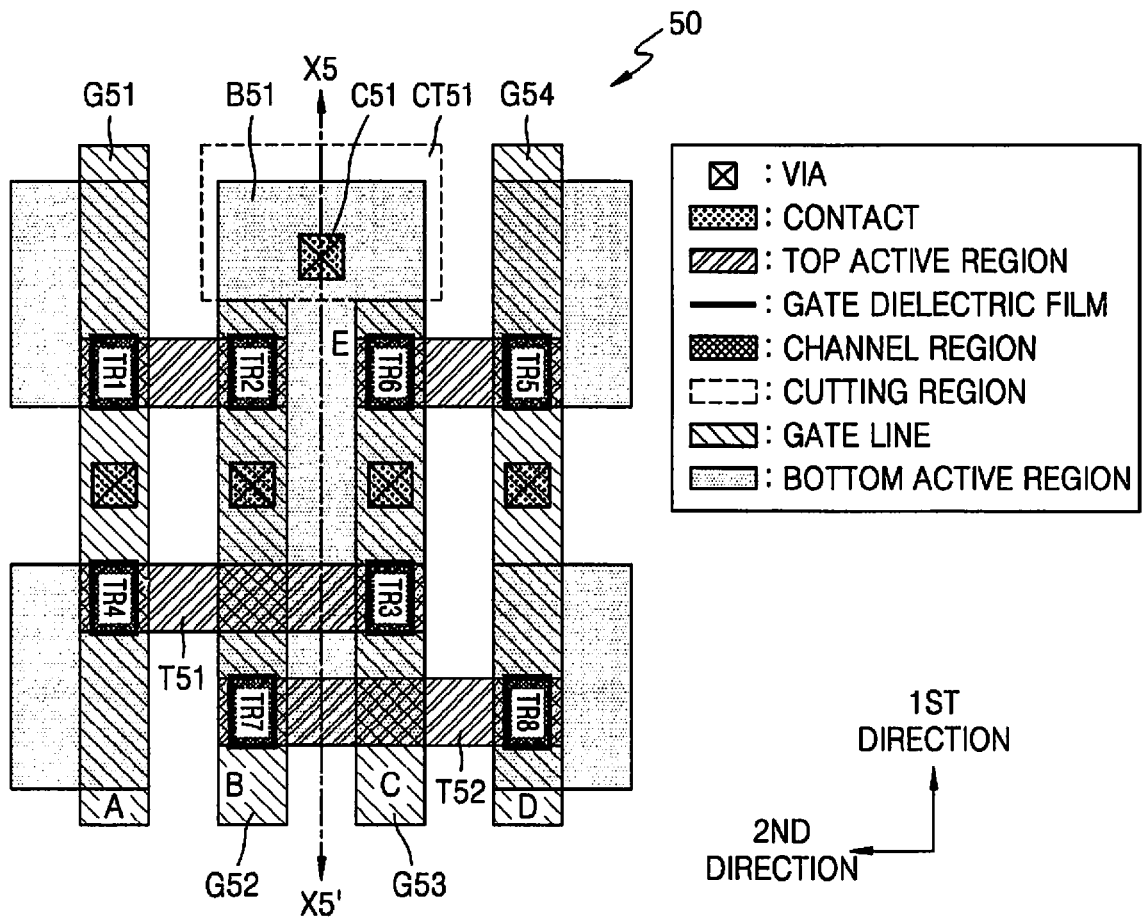
FIG. 5A is a plan view of a layout of an integrated circuit having a vertical transistor, according to some example embodiments of inventive concepts.
Figure 5B:
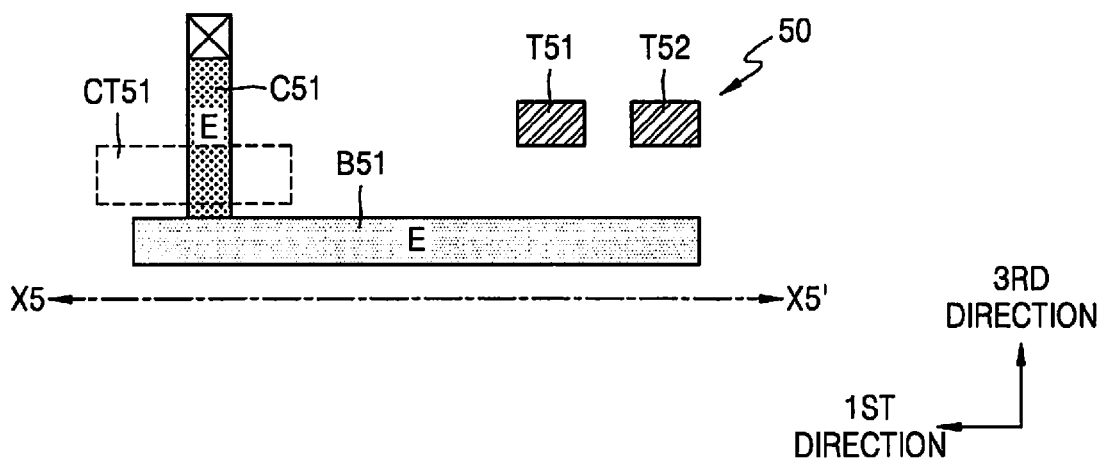
FIG. 5B is a cross-sectional view of the layout of FIG. 5A taken along line X5-X5'.

FIG. 5A is a plan view of a layout of an integrated circuit 50 having a vertical transistor, according to some example embodiments of inventive concepts, and FIG. 5B is a cross-sectional view of the layout of the integrated circuit 50 of FIG. 5A taken along line X5-X5'.

Referring to FIGS. 5A and 5B, the layout of the integrated circuit 50 may include first through fourth gate lines G51 through G54 extending in parallel in a first direction and the first through fourth gate lines G51 through G54 may form the transistors TR1 through TR8 in a region vertically overlapping all top and bottom active regions (e.g., in a third direction of FIG. 5B) by a gate dielectric layer and a channel region. The transistors TR1 through TR8 may share a first bottom active region B51 forming the node E. Transistors TR3 and TR4 may be connected to each other through a first top active region 151. Transistors TR7 and TR8 may be connected to each other through a second top active region T52.

According to some example embodiments of inventive concepts, a bottom active region may be electrically connected to a via through a contact formed in a cutting region that removes a gate line. For example, as illustrated in FIGS. 5A and 5B, the layout of the integrated circuit 50 may include a first cutting region CT51, and the first bottom active region B51 may be connected to a via through a first contact C51 penetrating the first cutting region CT51 and being over the first bottom active region B51. When compared to a planar transistor, a vertical transistor may occupy a relatively small area in a plane formed in first and second directions. Thus, vertical transistors may be densely arranged as illustrated in FIG. 5A. A cutting region (e.g., the first cutting region CT51) may be disposed in a region where vertical transistors are not disposed and a bottom active region (e.g., the first bottom active region B51) may be electrically connected to a via through a contact (e.g., the first contact C51) that penetrates the cutting region.

Figure 6A:
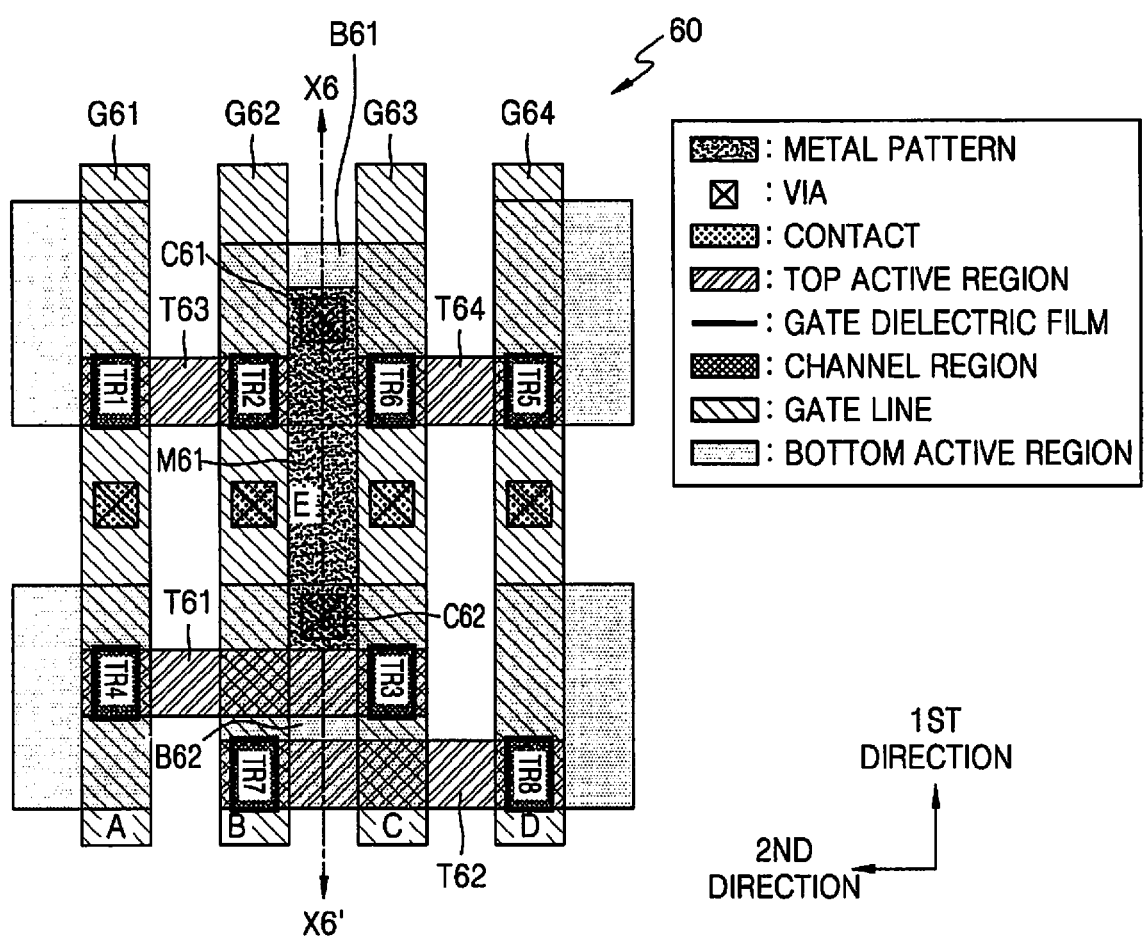
FIG. 6A is a plan view of a layout of an integrated circuit having a vertical transistor, according to some example embodiments of inventive concepts.
Figure 6B:
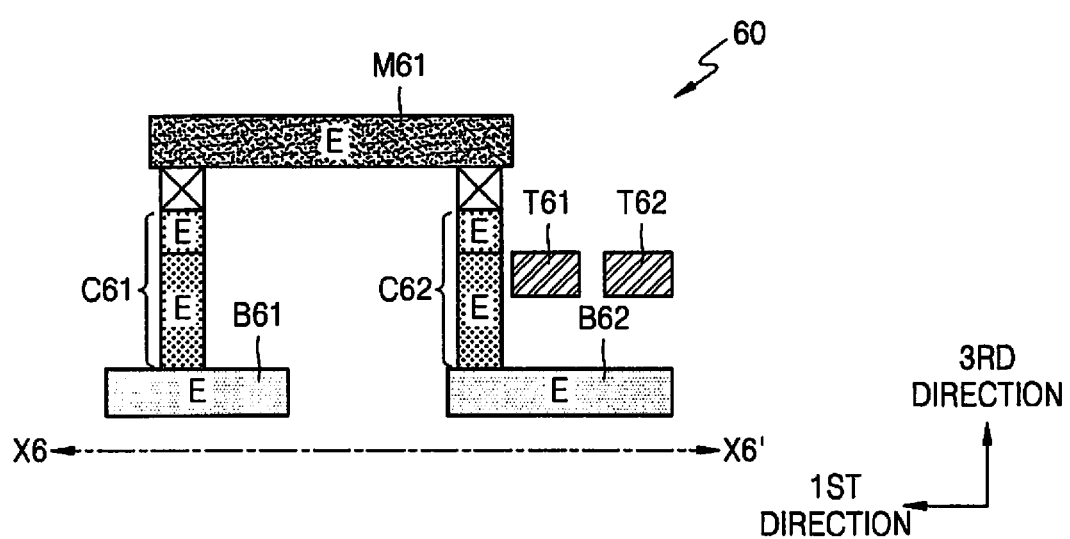
FIG. 6B is a cross-sectional view of the layout of FIG. 6A taken along line X6-X6'.

FIG. 6A is a plan view of a layout of an integrated circuit 60 having a vertical transistor, according to some example embodiments of inventive concepts, and FIG. 6B is a cross-sectional view of the layout of the integrated circuit 60 of FIG. 6A taken along line X6-X6'.

Referring to FIGS. 6A and 6B, the layout of the integrated circuit 60 may include first through fourth gate lines G61 through G64 extending in parallel in a first direction and the first through fourth gate lines G61 through G64 may form the transistors TR1 through TR8 in a region vertically overlapping top and bottom active regions (e.g., in a third direction of FIG. 6B) by a gate dielectric layer and a channel region.

According to some example embodiments of inventive concepts, transistors formed by using an identical gate line may not share a bottom active region. For example, the layout of the integrated circuit 60 may include first and second bottom active regions B61 and B62 separated from each other, and the second and sixth transistors TR2 and TR6 may share the first bottom active region B61 and the third and seventh transistors TR3 and TR7 may share the second bottom active region B62. Referring to FIG. 6A, the second and sixth transistors TR2 and TR6 sharing the first bottom active region B61 may be PMOS transistors and the third and seventh transistors TR2 and TR7 sharing the second bottom active region B62 may be NMOS transistors. That is, a bottom active region may be shared by transistors of an identical type.

Referring to FIG. 6A, the first and second bottom active regions B61 and B62 may be electrically connected to each other through first and second contacts C61 and C62 disposed between the second and third gate lines G62 and G63 and a first metal pattern M61. Referring to FIG. 6B, the first bottom active region B61 may be electrically connected to the second bottom active region B62 through the first contact C61, a via, the first metal pattern M61, a via, and the second contact C62. Each of the first and second contacts C61 and C62 may include bottom and top contacts, as illustrated in FIG. 6B. The integrated circuit 60 includes a first top active region T61 and a second top active region T62. The integrated circuit 40 may include a third top active region T63, which may form a first transistor TR1 with the first gate line G61 and a second transistor TR2 with the second gate line G62. The integrated circuit 60 may include a fourth top active region T64, which may form a fifth transistor TR5 with the fourth gate line G44 and a sixth transistor TR6 with the third gate line G63.

Figure 7A:
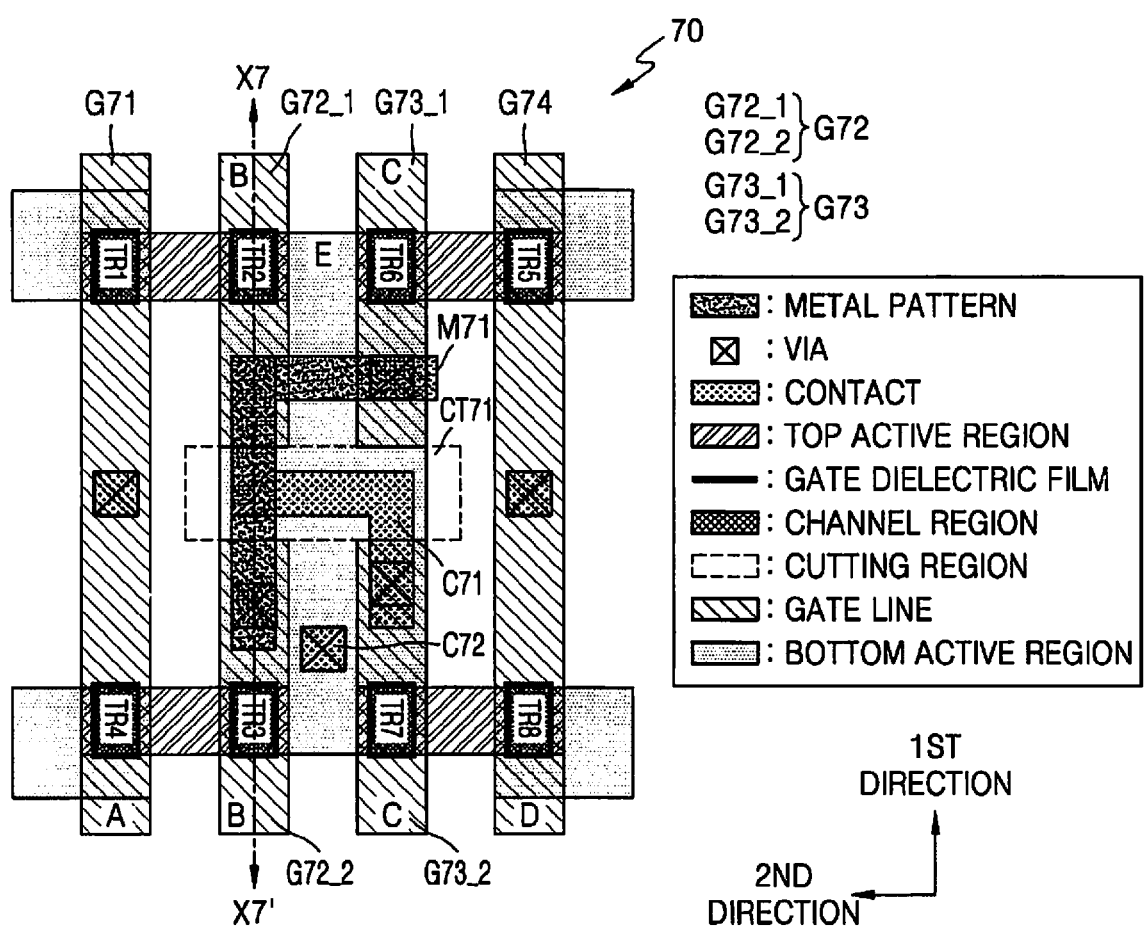
FIG. 7A is a plan view of a layout of an integrated circuit having a vertical transistor, according to some example embodiments of inventive concepts.
Figure 7B:
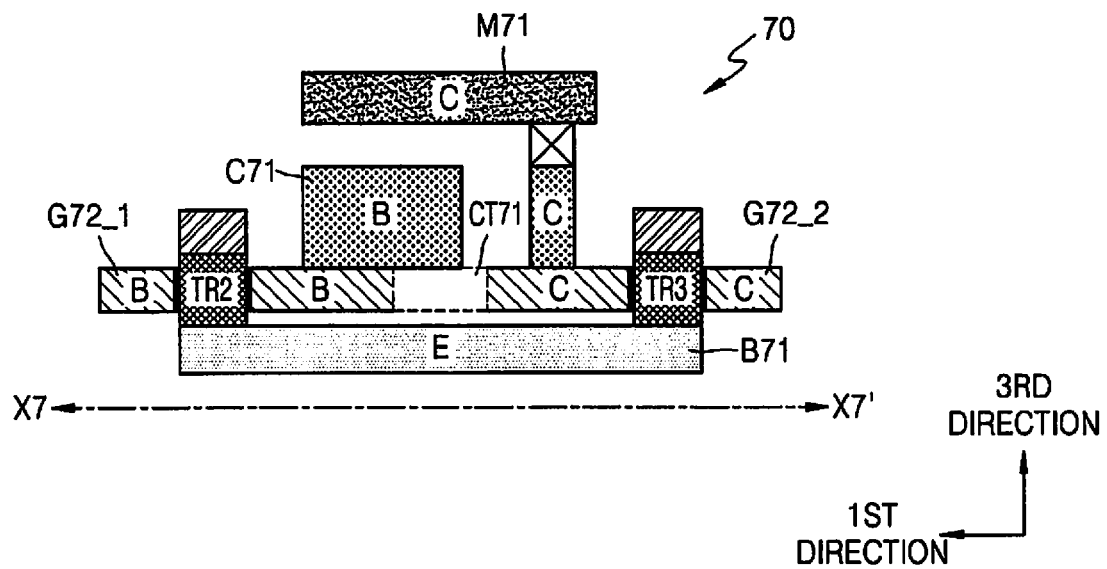
FIGS. 7B and 7C are example cross-sectional views of the layout of FIG. 7A taken along line X7-X7'.
Figure 7C:
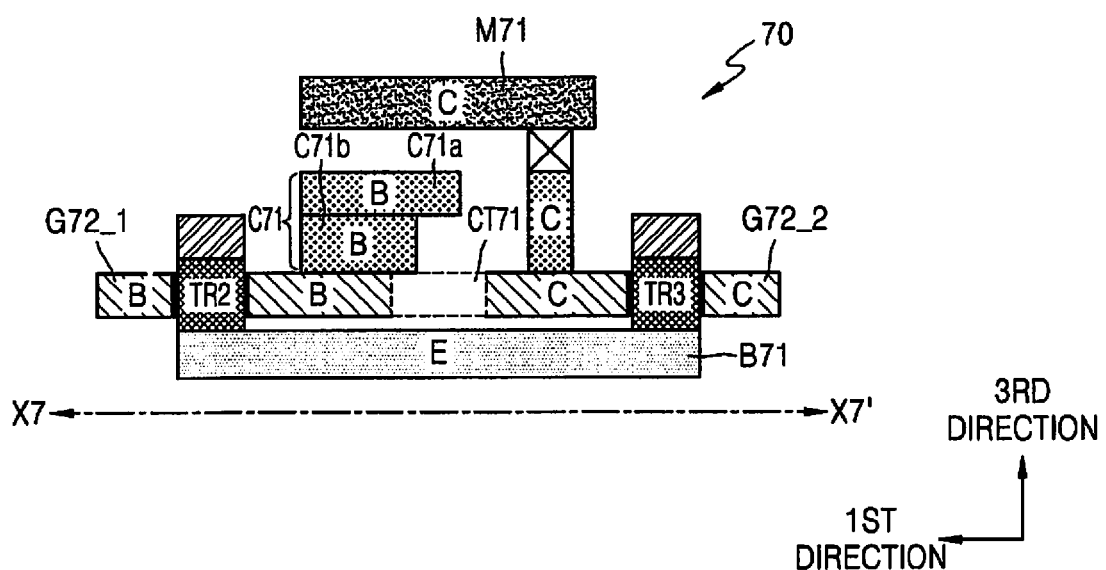

FIG. 7A is a plan view of a layout of an integrated circuit 70 having a vertical transistor, according to some example embodiments of inventive concepts, and FIGS. 7B and 7C are example cross-sectional views of the layout of the integrated circuit 70 of FIG. 7A taken along line X7-X7'.

Referring to FIG. 7A, the layout of the integrated circuit 70 may include first through fourth gate lines G71 through G74 extending in parallel in a first direction and the first through fourth gate lines G71 through G74 may form the transistors TR1 through TR8 in a region vertically overlapping top and bottom active regions (e.g., in a third direction of FIG. 7B) by a gate dielectric layer and a channel region. The layout of the integrated circuit 70 of FIG. 7A may include a first cutting region CT71 for separating the second and third gate lines G72 and G73 from each other similarly to the layout of the integrated circuit 30 of FIG. 3.

Each of the first and fourth gate lines G71 and G74 may be used to integrally form pairs of PMOS transistors (e.g., TR1 and TR5) and NMOS transistors (e.g., TR4 and TR8), and the second and third gate lines G72 and G73 may be separated from each other by the first cutting region CT71 including an insulator. For example, the first cutting region CT71 may divide (or remove) a part of the second gate line G72 and a part of the third gate lines G73 such that the second gate line G72 and the third gate line G73 do not extend into the first cutting region. For example, the second gate line G72 may be divided into two partial gate lines G72_1 and G72_2 by the first cutting region CT71, and the third gate line G73 may be divided into two partial gate lines G73_1 and G73_2 by the first cutting region CT71. As a result, the partial gate lines G72_1 and G72_1 may be aligned in a first direction and the partial gate lines G73_1 and G73_2 may also be aligned in a first direction. The gates of the transistors (e.g., TR2 and TR7) connected to the node B of FIG. 2 may include the partial gate line G72_1 of the second gate line G72 and a third gate line G73_2 of the third gate line G73, and as illustrated in FIG. 7A, the partial gate lines G72_1 and G73_2 may be electrically connected to each other through a first contact C71. The first contact C71 may be referred to as a first connection structure. Similarly, the gates of the transistors TR3 and TR6) connected to the node C of FIG. 2 may be respectively formed by the partial gate line G72_2 of the second gate line G72 and the partial gate line G73_1 of the third gate line G73, and as illustrated in FIG. 7A, the partial gate lines G72_2 and G73_1 may be electrically connected to each other through contacts, vias, and a first metal pattern M71. The first metal pattern M71 may be referred to as a second connection structure.

The second, third, sixth, and seventh transistors TR2, TR3, TR6, and TR7 may share a first bottom active region B71 forming the node E. Accordingly, a contact or a metal pattern for connecting the second, third, sixth, and seventh transistors TR2, TR3, TR6, and TR7 to the node E may be omitted. As illustrated in FIG. 7A, the first bottom active region 1371 may be electrically connected to a via through a second contact C72 disposed between the second and third gate lines G72 and G73.

Referring to FIG. 7B, the first contact C71 forming the node B and connecting the partial gate lines G72_1 and G73_2 may have the same height (e.g., a length in the third direction) as a contact electrically connecting the second or third gate line G72 or G73 with the via. That is, the first contact C71 may be formed through a single patterning process.

Referring to FIG. 7C, the first contact C71 forming the node B and connecting the partial gate lines G72_1 and G73_2 may include a contact C71a electrically connecting a top active region to the via and a contact C71b electrically connecting the contact C71a to the gate lines. That is, the first contact C71 may be formed through a patterning process for forming the contact C71b and a patterning process for forming the contact C71a.

Figure 8A:
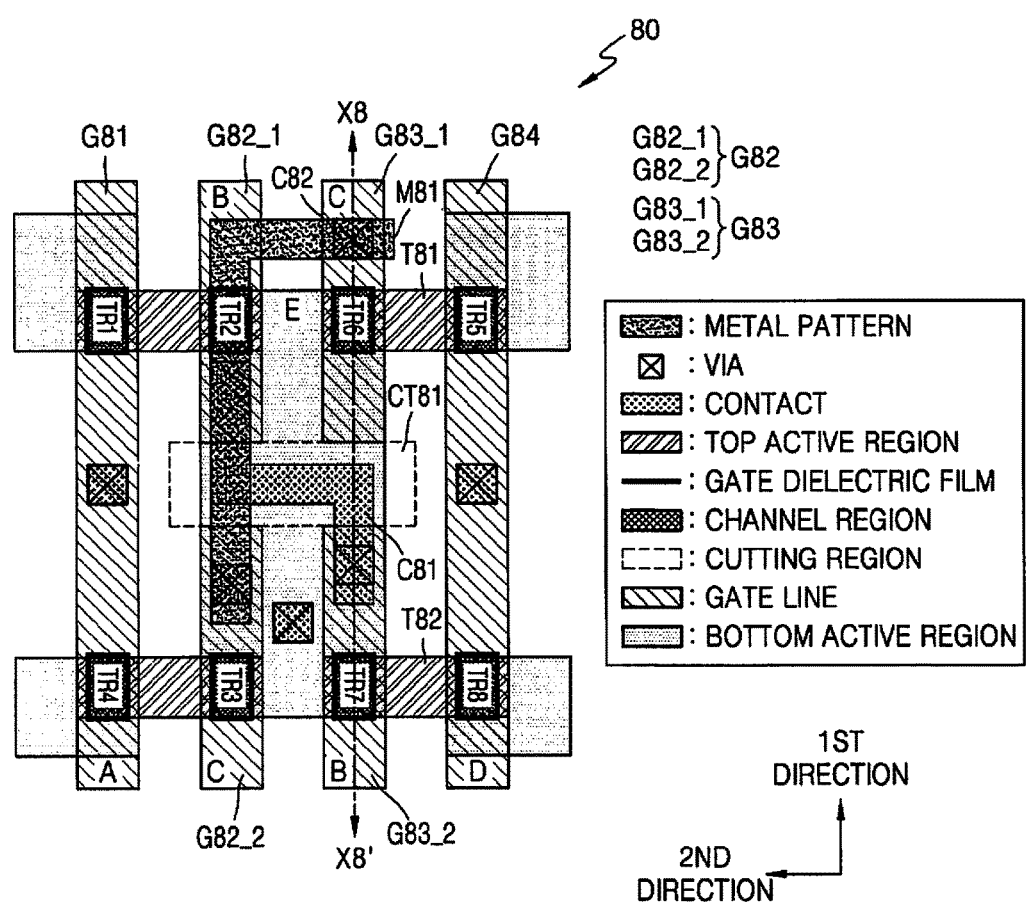
FIG. 8A is a plan view of a layout of an integrated circuit having a vertical transistor, according to some example embodiments of inventive concepts.
Figure 8B:
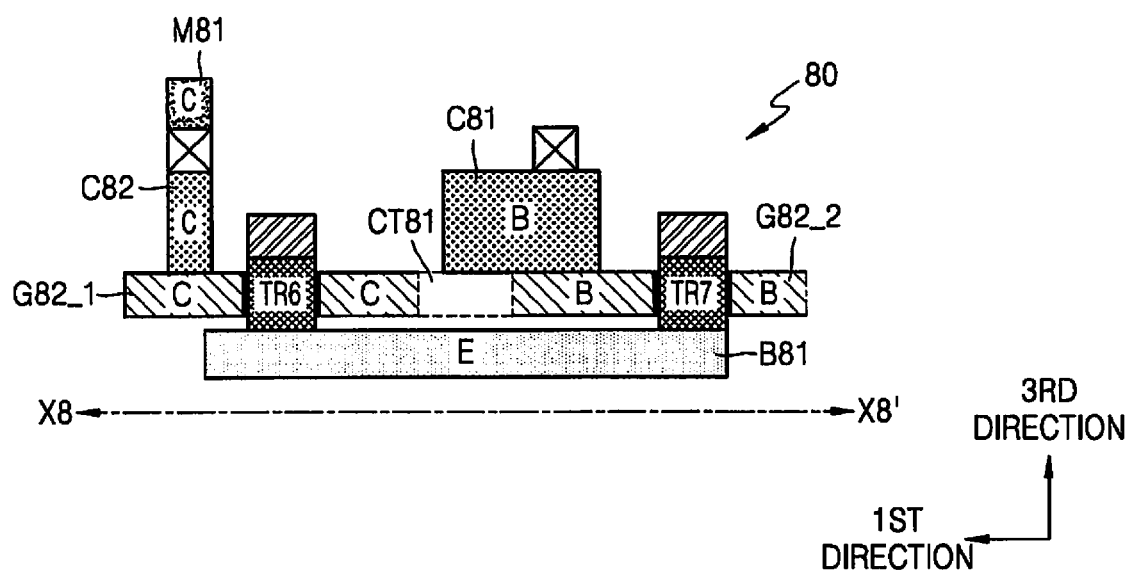
FIG. 8B is a cross-sectional view of the layout of FIG. 8A taken along line X8-X8'.

FIG. 8A is a plan view of a layout of an integrated circuit 80 having a vertical transistor, according to some example embodiments of inventive concepts, and FIG. 8B is a cross-sectional view of the layout of the integrated circuit 80 of FIG. 8A taken along line X8-X8'.

Referring to FIG. 8A, the layout of the integrated circuit 80 may include first through fourth gate lines G81 through G84 extending in parallel in a first direction and the first through fourth gate lines G81 through G84 may form the transistors TR1 through TR8 in a region vertically overlapping top and bottom active regions (e.g., in a third direction of FIG. 8B) by a gate dielectric layer and a channel region. The layout of the integrated circuit 80 of FIG. 8A may include a first cutting region CT81 for separating the second and third gate lines G82 and G83 from each other similarly to the layout of the integrated circuit 70 of FIGS. 7A and 7B.

According to some example embodiments of inventive concepts, a contact for electrically connecting partial gate lines may not be disposed between the transistors. For example, as illustrated in FIG. 8A, a partial gate line G82_2 of the second gate line G82 and a partial gate line G83_1 of the third gate line G83 may be electrically connected to each other through contacts, vias, and a first metal pattern M81 while a partial gate line G82_1 of the second gate line G82 and a partial gate line G83_2 of the third gate line G83 are electrically connected to each other through a first contact C81. As illustrated in FIGS. 8A and 8B, a second contact C82 for contacting the node C to the partial gate line G83_1 of the third gate line G83 may not be disposed between the sixth transistor TR6 and the seventh transistor TR7, and thus the second contact C82 may be disposed farther from a second active region T82 than a first active region T81. As described above, when compared to a planar transistor, a vertical transistor may occupy a relatively small area in a plane formed in first and second directions, and accordingly, as illustrated in FIGS. 8A and 8B, a contact contacting a gate line may not be disposed between pairs of PMOS transistors and NMOS transistors and routing congestion between the pairs of PMOS transistors and NMOS transistors may be reduced. The first contact C81 may be referred to as a first connection structure. The first metal pattern M81 may be referred to as a second connection structure.

Figure 9A:
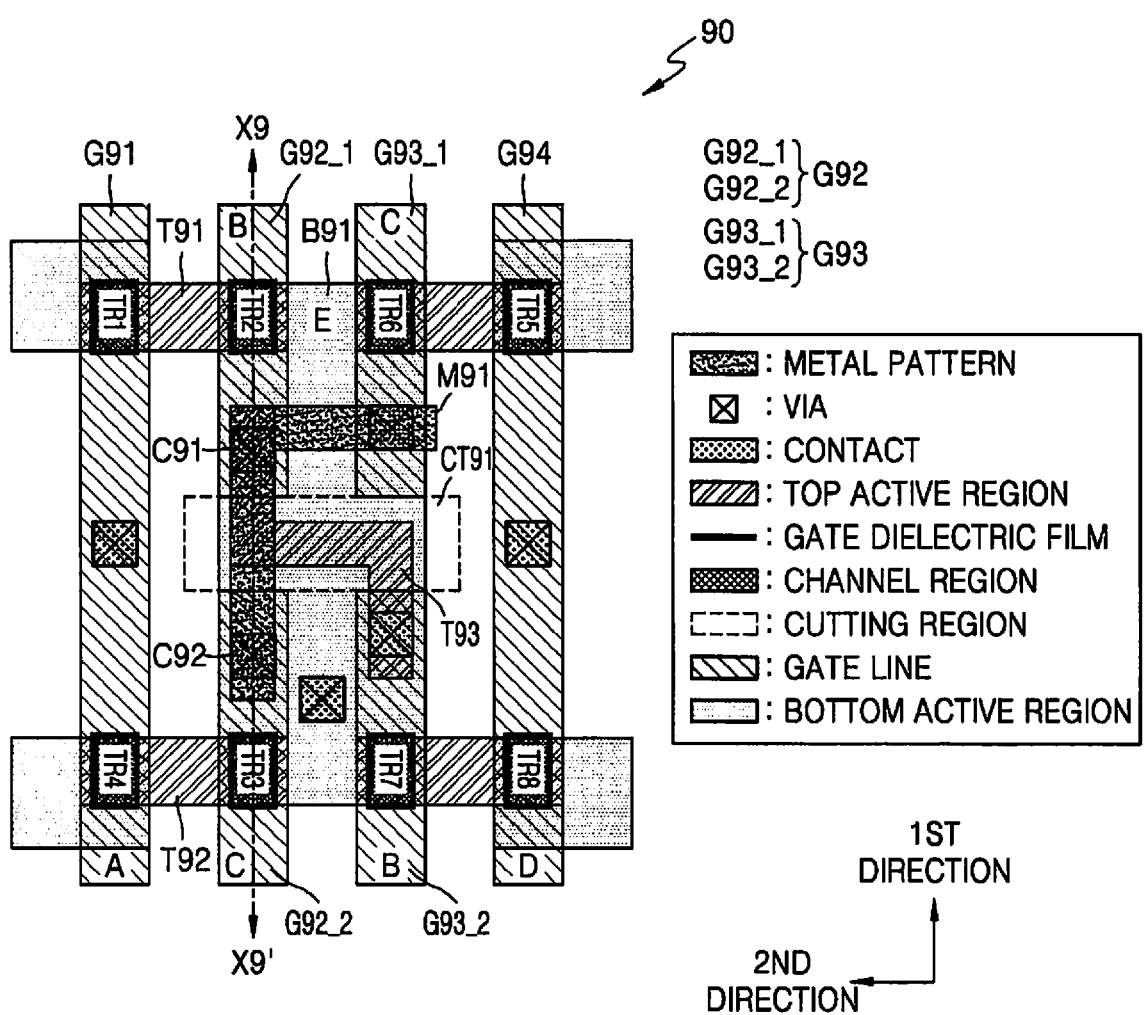
FIG. 9A is a plan view of a layout of an integrated circuit having a vertical transistor, according to some example embodiments of inventive concepts.
Figure 9B:
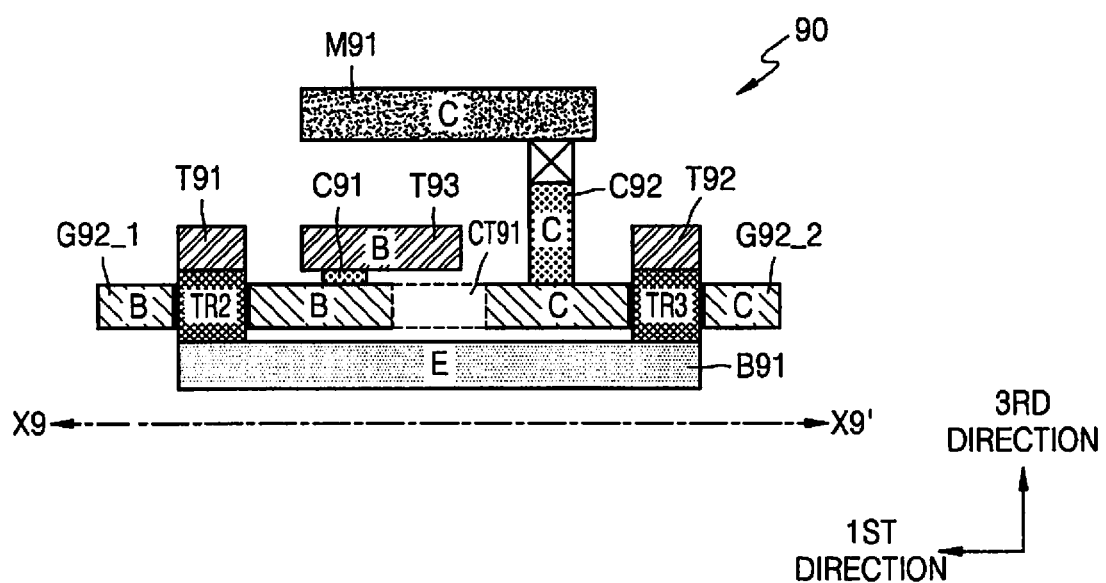
FIG. 9B is a cross-sectional view of the layout of FIG. 9A taken along line X9-X9'.

FIG. 9A is a plan view of a layout of an integrated circuit 90 having a vertical transistor, according to some example embodiments of inventive concepts, and FIG. 9B is a cross-sectional view of the layout of the integrated circuit 90 of FIG. 9A taken along line X9-X9'.

Referring to FIG. 9A, the layout of the integrated circuit 90 may include first through fourth gate lines G91 through G94 extending in parallel in a first direction and the first through fourth gate lines G91 through G94 may be used to form the transistors TR1 through TR8 in a region vertically overlapping top and bottom active regions (e.g., in a third direction of FIG. 9B) by a gate dielectric layer and a channel region. The layout of the integrated circuit 90 of FIG. 9A may include a first cutting region CT91 for separating the second and third gate lines G92 and G93 from each other similarly to the layout of the integrated circuit 70 of FIGS. 7A and 7B. The integrated circuit 90 includes a first top active region 91 and a second top active region T92.

According to some example embodiments of inventive concepts, a top active region may be used to electrically connect partial gate lines. That is, a top active region may be used to electrically connect gates of cross-coupled transistors. For example, as illustrated in FIGS. 9A and 9B, a partial gate line G92_1 of the second gate line G92 and a partial gate line G93_2 of the third gate line G93 may be connected to a third top active region T93. The third top active region T93 may be electrically connected to the partial gate lines G92_1 and G93_2 through a contact. For example, as illustrated in FIGS. 9A and 9B, the partial gate line G92_1 of the second gate line G92 may be electrically connected to the third top active region T93 through a first contact C91.

Figure 10A:
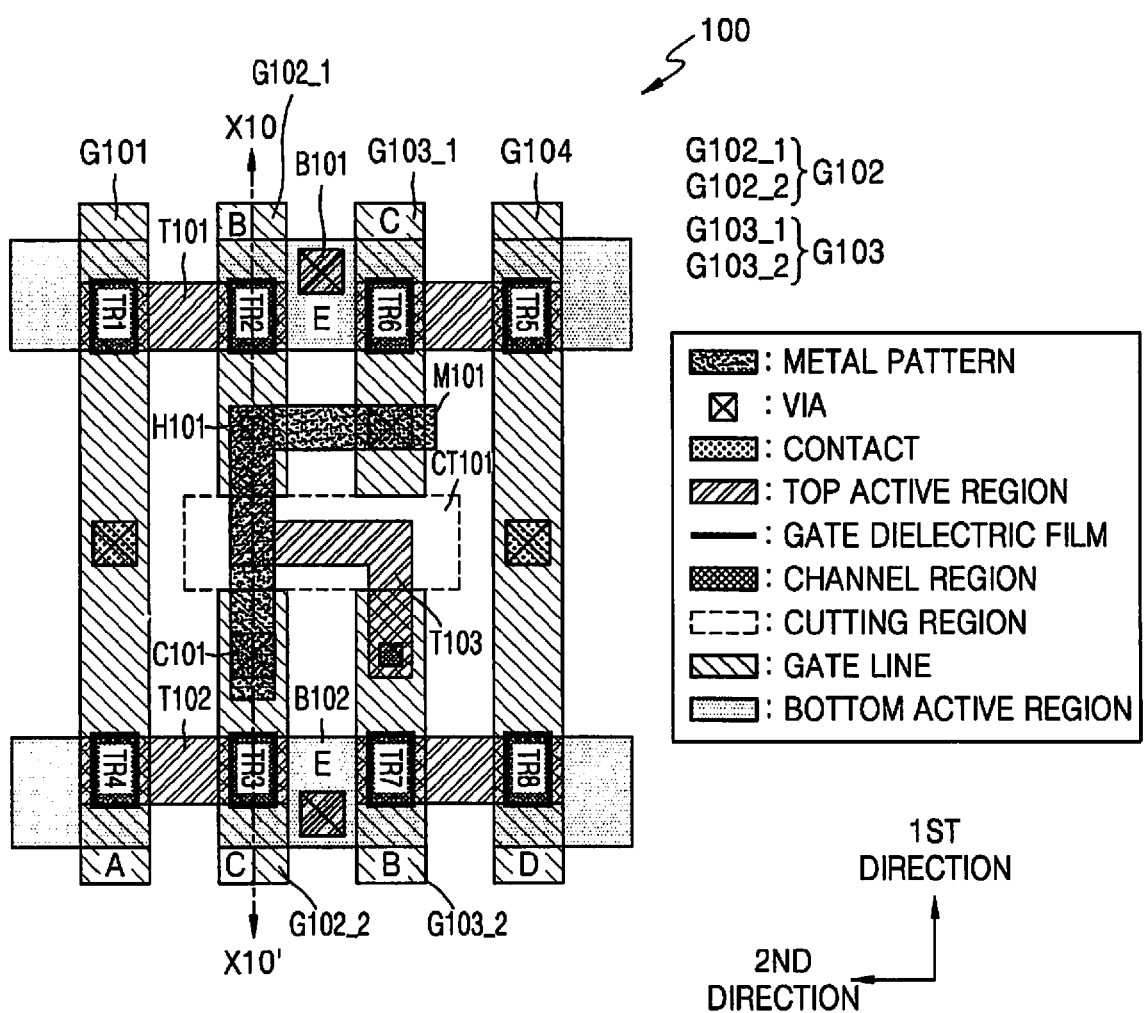
FIG. 10A is a plan view of a layout of an integrated circuit having a vertical transistor, according to some example embodiments of inventive concepts.
Figure 10B:
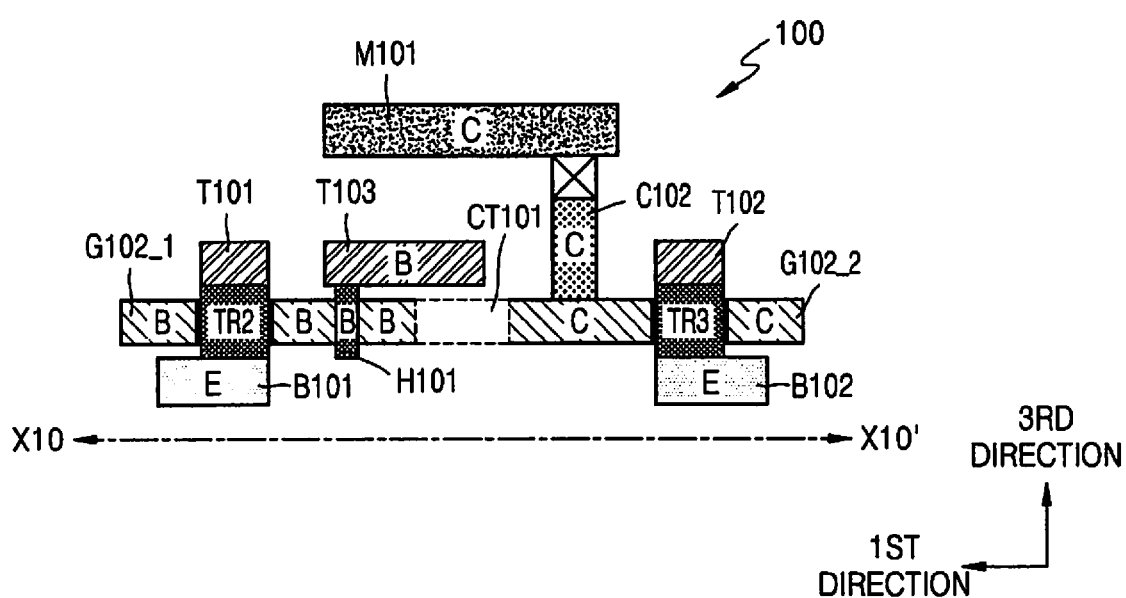
FIG. 10B is a cross-sectional view of the layout of FIG. 10A taken along line X10-X10'.

FIG. 10A is a plan view of a layout of an integrated circuit 100 having a vertical transistor, according to some example embodiments of inventive concepts, and FIG. 10B is a cross-sectional view of the layout of the integrated circuit 100 of FIG. 10A taken along line X10-X10'.

Referring to FIG. 10A, the layout of the integrated circuit 100 may include first through fourth gate lines G101 through G104 extending in parallel in a first direction and the first through fourth gate lines G101 through G104 may be used to form the transistors TR1 through TR8 in a region vertically overlapping top and bottom active regions (e.g., in a third direction of FIG. 10B) by a gate dielectric layer and a channel region. A partial gate line G102_1 of the second gate line G102 and a partial gate line G103_2 of the third gate line G103 may be electrically connected to each other through a third top active region T103 similarly to the layout of the integrated circuit 90 of FIGS. 9A and 9B. In addition, the layout of the integrated circuit 100 of FIG. 10A may include first and second bottom active regions B101 and B102 separated from each other. The integrated circuit 100 includes a first top active region T101 and a second top active region T102.

According to some example embodiments of inventive concepts, a channel region may be used to electrically connect a gate line and a top active region. That is, a gate line and a top active region may be electrically connected to each other by a channel region that contacts the gate line (e.g., without forming a gate dielectric layer between the gate line and the channel region) and penetrates through the gate line. For example, referring to FIGS. 10A and 10B, a first channel region H101 contacting and penetrating the partial gate line G102_1 of the second gate line G102 may be disposed, and a second channel region H102 contacting and penetrating the partial gate line G103_2 of the third gate line G103 may be disposed. Although FIGS. 10A and 10B illustrate that the first and second channel regions H101 and H102 have a smaller cross-sectional area than channel regions forming transistors on a plane formed by first and second directions, the inventive concept is not limited thereto.

A channel region for electrically connecting a gate line and a top active region may not vertically overlap a bottom active region. That is, the bottom active region under the channel region may be removed to limit and/or prevent unnecessary electrical connection with the bottom active region. For example, as illustrated in FIG. 10B, a bottom active region may not be disposed under the first channel region H101 electrically connecting the partial gate line G102_1 of the second gate line G102 and the third top active region T103.

Figure 11A:
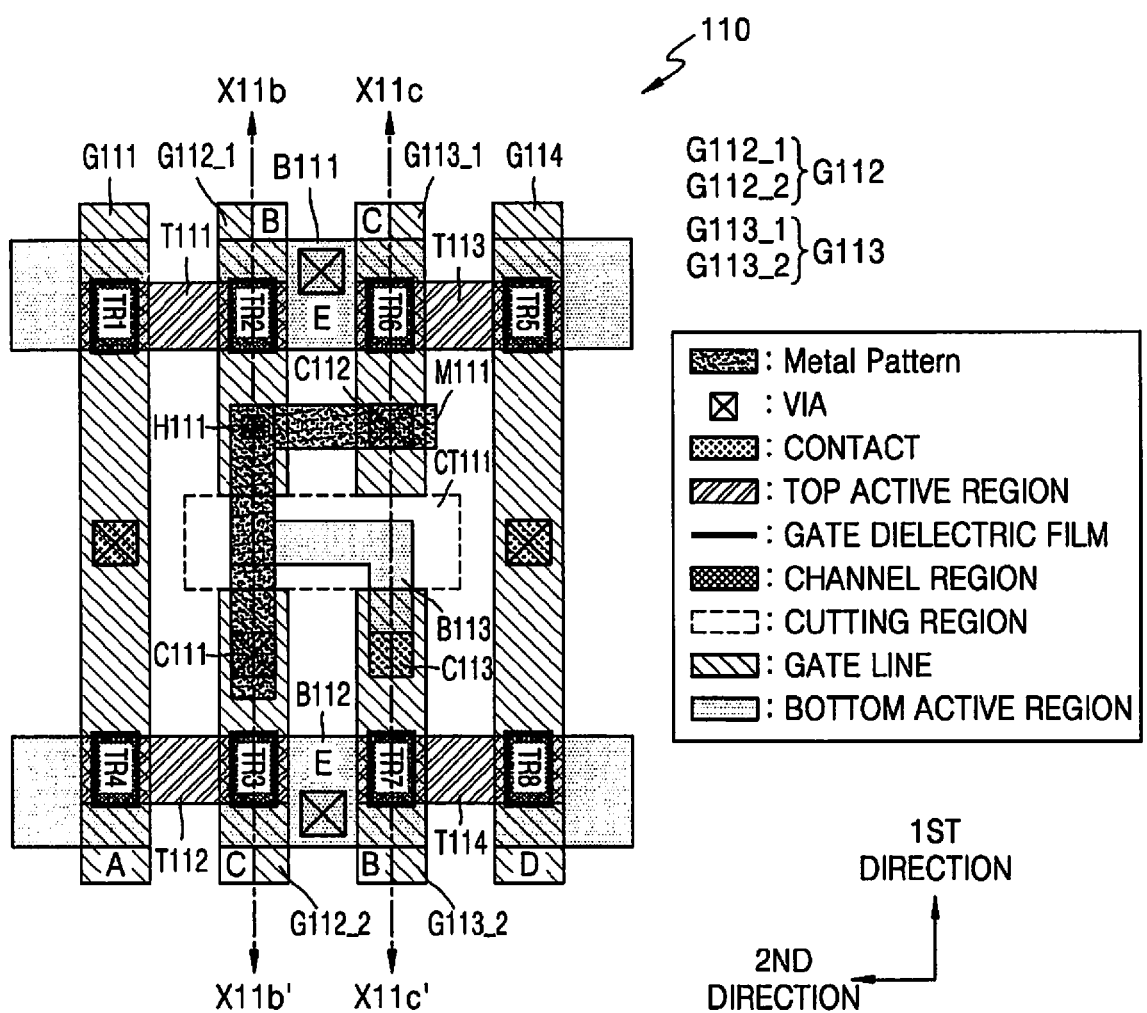
FIG. 11A is a plan view of a layout of an integrated circuit having a vertical transistor, according to some example embodiments of inventive concepts.
Figure 11B:
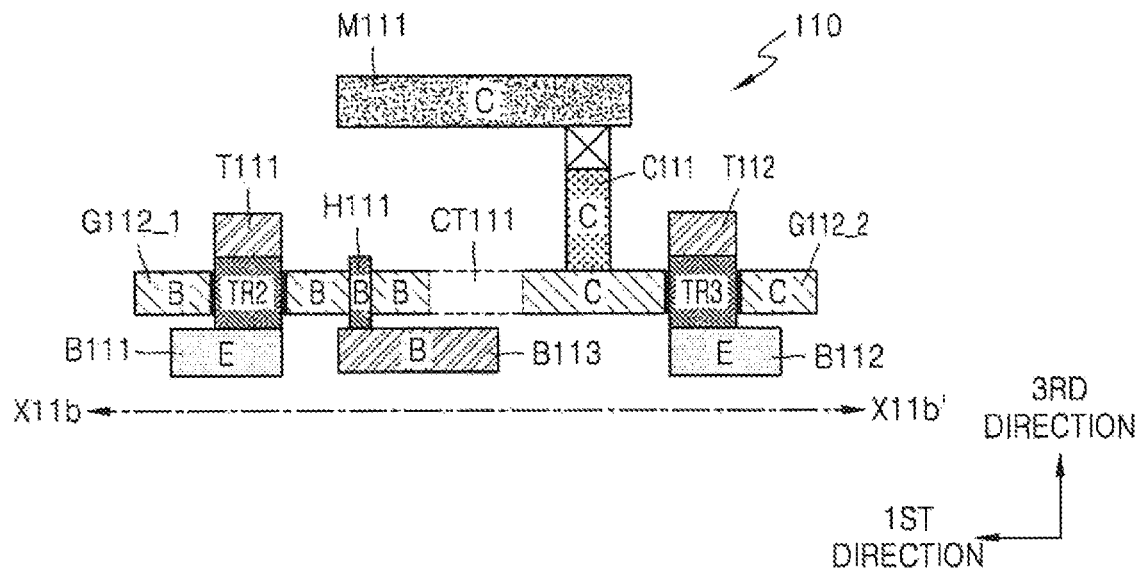
FIGS. 11B and 11C are cross-sectional views of the layout of FIG. 11A taken along line X11$b$-X11$b$' and line X11$c$-X11$c$'.
Figure 11C:
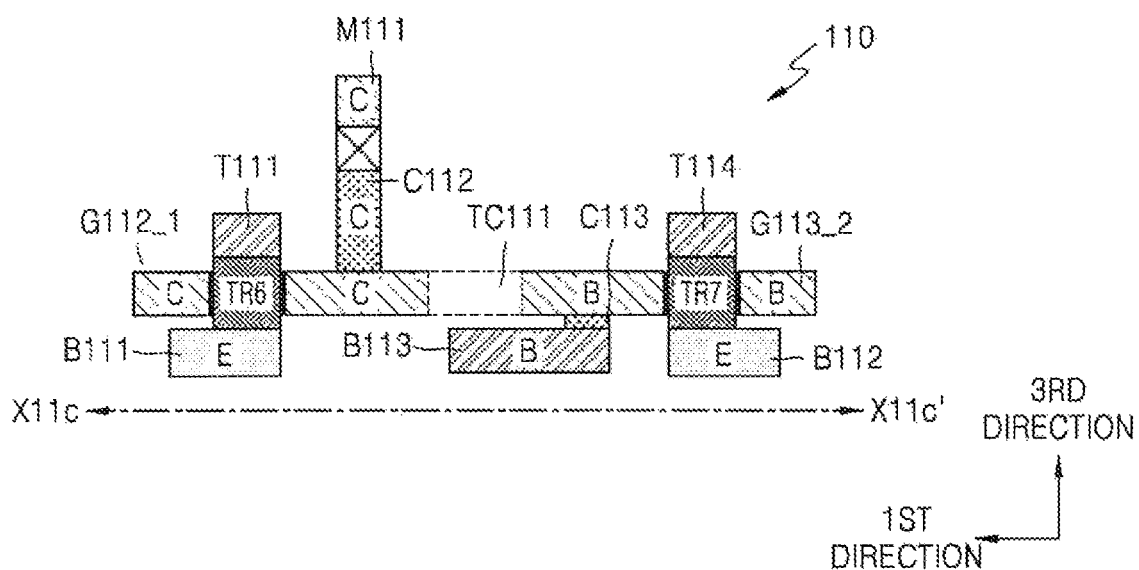

FIG. 11A is a plan view of a layout of an integrated circuit 110 having a vertical transistor, according to some example embodiments of inventive concepts, and FIGS. 11B and 11C are cross-sectional views of the layout of FIG. 11A taken along line X11b-X11b' and line X11c-X11c'.

Referring to FIG. 11A, the layout of the integrated circuit 110 may include first through fourth gate lines G111 through G114 extending in parallel in a first direction and the first through fourth gate lines G111 through G114 may be used to form the transistors TR1 through TR8 in a region vertically overlapping top and bottom active regions (e.g., in a third direction of FIG. 11B) by a gate dielectric layer and a channel region. The layout of the integrated circuit 110 of FIG. 11A may include a first cutting region CT111 for separating the second and third gate lines G112 and G113 from each other similarly to the layout of the integrated circuit 70 of FIGS. 7A and 7B. In addition, the layout of the integrated circuit 110 of FIG. 11A may include first and second bottom active regions B111 and B112 separated from each other. The integrated circuit 110 includes a plurality of top active regions (e.g., T111, T112, T113, and T114).

According to some example embodiments of inventive concepts, a bottom active region may be used to electrically connect partial gate lines. That is, a bottom active region may be used to electrically connect gates of cross-coupled transistors. For example, as illustrated in FIGS. 11A and 11B, a partial gate line G112_1 of the second gate line G112 and a partial gate line G113_2 of the third gate line G113 may be connected to a third bottom active region B113.

A bottom active region may be electrically connected to gate lines through a channel region similarly to a top active region used to connect gate lines. For example, as illustrated in FIG. 11B, the partial gate line G112_1 of the second gate line G112 and the third bottom active region B113 may be electrically connected to each other through a first channel region H111. A top active region on a channel region may be removed to limit and/or prevent unnecessary electrical connection with the top active region. That is, as illustrated in FIG. 11B, a top active region may not be over the first channel region H111. The integrated circuit 120 includes a plurality of top active regions (e.g., T121, T122, T123, T124, and T125).

A bottom active region may be electrically connected to gate lines through a contact similarly to a top active region used to connect gate lines. For example, as illustrated in FIG. 11C, the partial gate line G113_2 of the third gate line G113 and the third bottom active region B113 may be electrically connected to each other through a third contact C113.

Figure 12A:
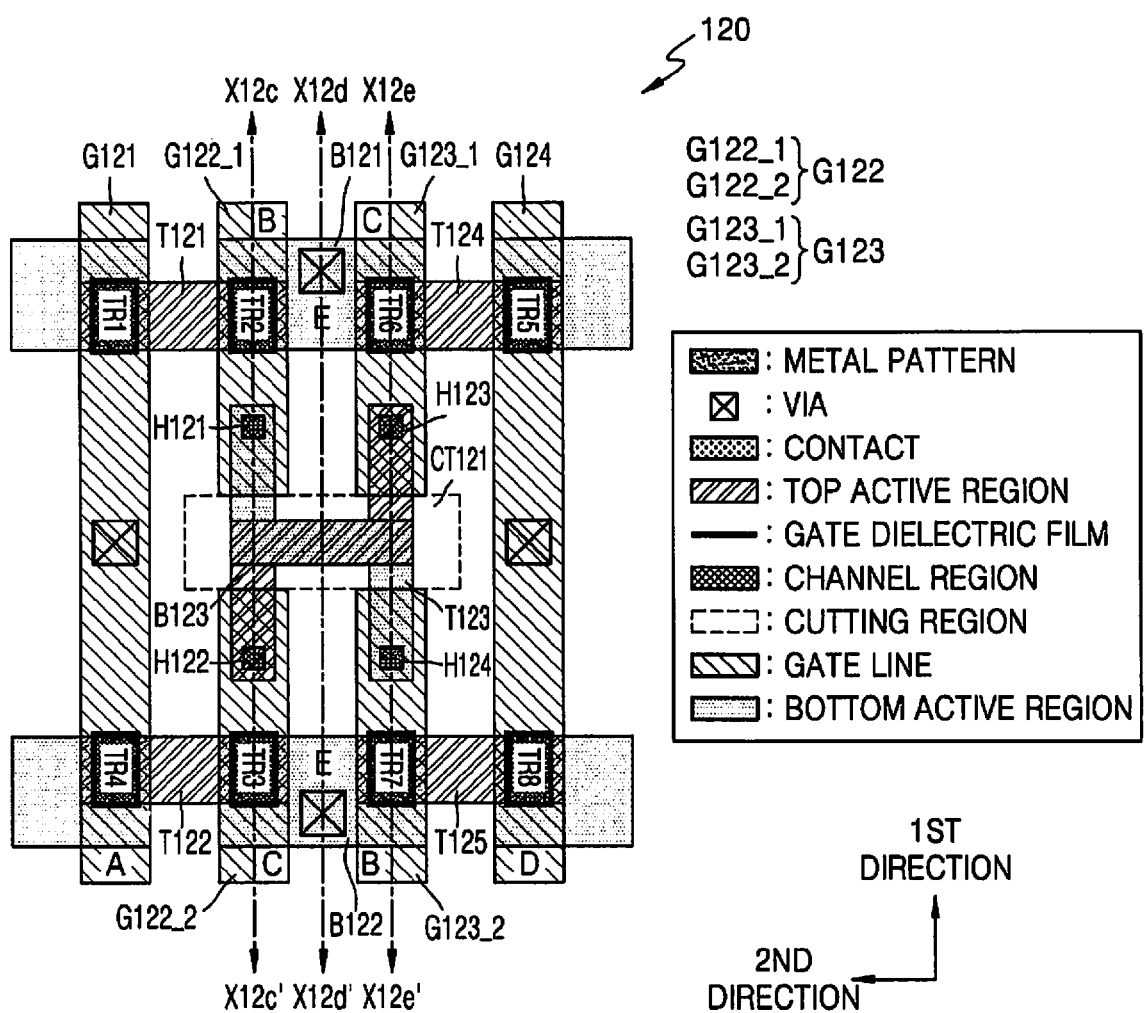
FIG. 12A is a plan view of a layout of an integrated circuit having a vertical transistor, according to some example embodiments of inventive concepts.
Figure 12B:
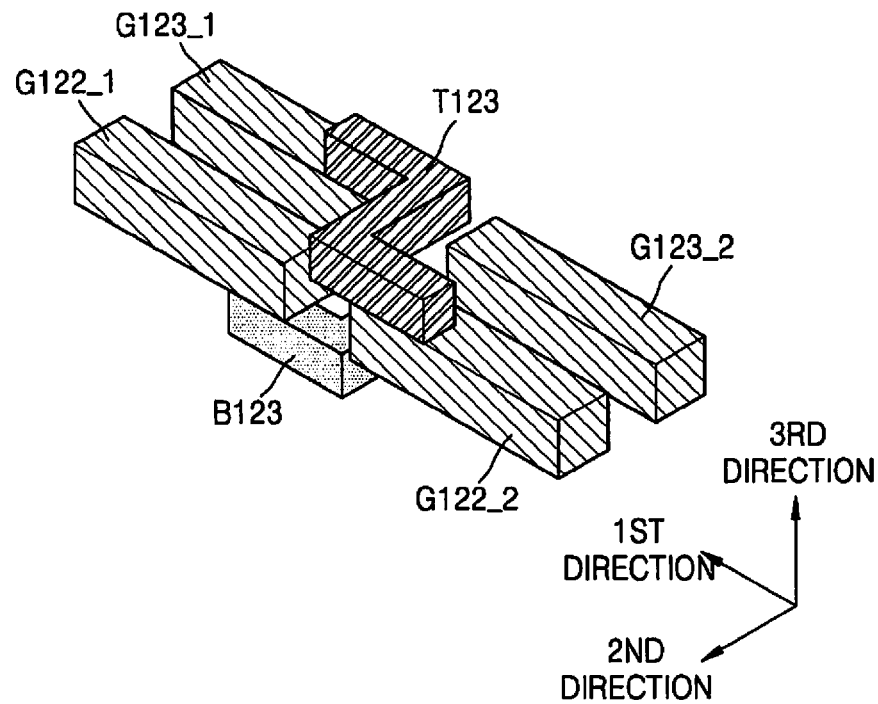
FIG. 12B is a perspective view of a part of the layout of FIG. 12A.

FIG. 12A is a plan view of a layout of an integrated circuit 120 having a vertical transistor, according to some example embodiments of inventive concepts, FIG. 12B is a perspective view of a part of the layout of the integrated circuit 120 of FIG. 12A, and FIGS. 12C through 12E are cross-sectional views of the layout of the integrated circuit 120 of FIG. 12A taken along line X12c-X12c', line X12d-X12d', and line X12e-X12e', respectively.

Referring to FIG. 12A, the layout of the integrated circuit 120 may include first through fourth gate lines G121 through GI 24 extending in parallel in a first direction and the first through fourth gate lines G121 through G124 may form the transistors TR1 through TR8 in a region vertically overlapping top and bottom active regions (e.g., in a third direction of FIG. 12B) by a gate dielectric layer and a channel region. The layout of the integrated circuit 120 of FIG. 12A may include a first cutting region CT121 for separating the second and third gate lines G122 and G123 from each other similarly to the layout of the integrated circuit 70 of FIGS. 7A and 7B. In addition, the layout of the integrated circuit 120 of FIG. 12A may include first and second bottom active regions B121 and B122 separated from each other.

According to some example embodiments of inventive concepts, a top active region and a bottom active region may be used together to electrically connect partial gate lines. That is, a top active region and a bottom active region may be used together to electrically connect gates of cross-coupled transistors. For example, as illustrated in FIG. 12A, a partial gate line G122_2 of the second gate line G122 and a partial gate line G133_2 of a third gate line G133 may be electrically connected to each other through a third top active region T123, and the partial gate line G122_2 of the second gate line G122 and a partial gate line G133_1 of the third gate line G133 may be electrically connected to each other through a third bottom active region B123.

Figure 12C:
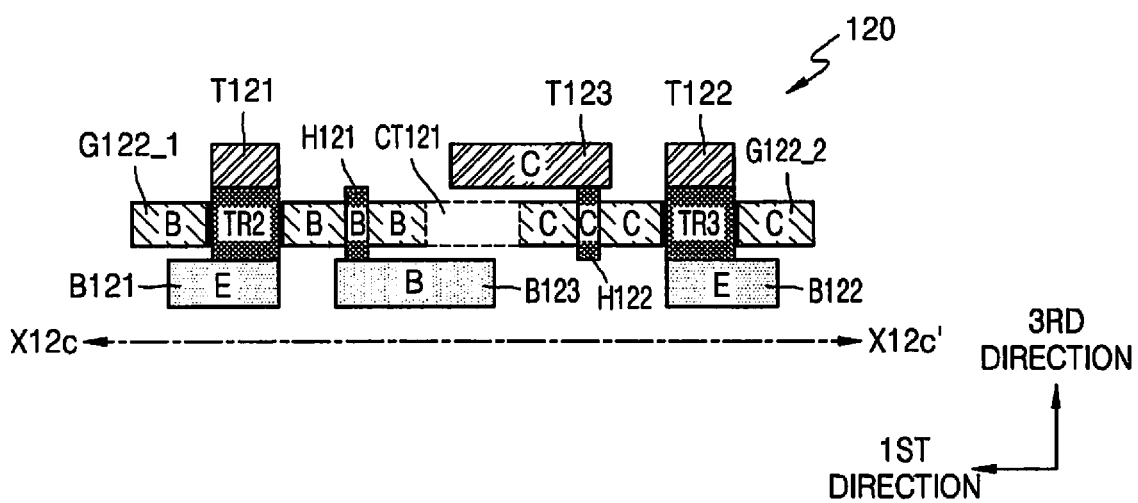
FIGS. 12C through 12E are cross-sectional views of the layout of FIG. 12A taken along line X12$c$-X12$e$, line X12$d$-X12$d$', and line X12$e$-X12$e$', respectively.
Figure 12D:
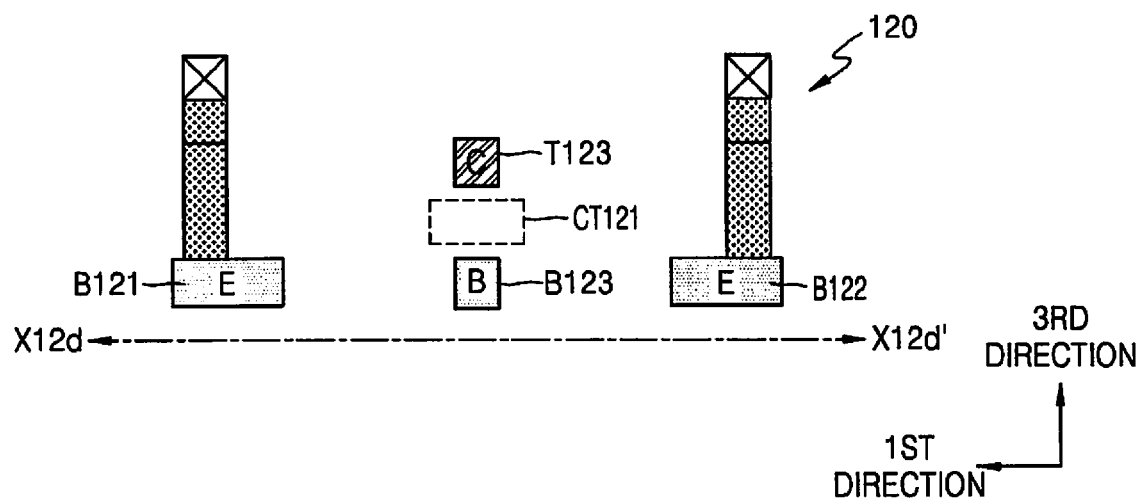

Referring to the perspective view of FIG. 12B, the third bottom active region B123, partial gate lines G122_1, G122_2, G123_1, and G123_2, and the third top active region T123 may be stacked on one another in the given order in a third direction. Since the third bottom active region B123 and the third top active region T123 are formed at different levels (e.g., heights in the third direction), respectively, the third bottom active region B123 and the third top active region T123 may be used to independently route gate lines (or partial gate lines). As illustrated in FIG. 12D, the third bottom active region B123 and the third top active region may be separated from each other in a region where the third bottom active region B123 and the third top active region T123 are overlapped with each other in the third direction. Furthermore, as illustrated in FIG. 12B, gate lines, a top and bottom active regions for connecting the gate lines may not be vertically overlapped (e.g., in the third direction).

A top active region and a bottom active region may be electrically connected to gate lines through a channel region. For example, as illustrated in FIG. 12C, the partial gate line G122_1 of the second gate line G122 and the third bottom active region B123 may be electrically connected to each other through a first channel region H121, and a top active region on the first channel region H121 may be removed to limit and/or prevent unnecessary electrical connection with the top active region. In addition, the partial gate line G122_2 of the second gate line G122 and the third top active region T123 may be electrically connected to each other through a second channel region H122, and a bottom active region under the second channel region H122 may be removed to limit and/or prevent unnecessary electrical connection with the bottom active region.

Figure 12E:
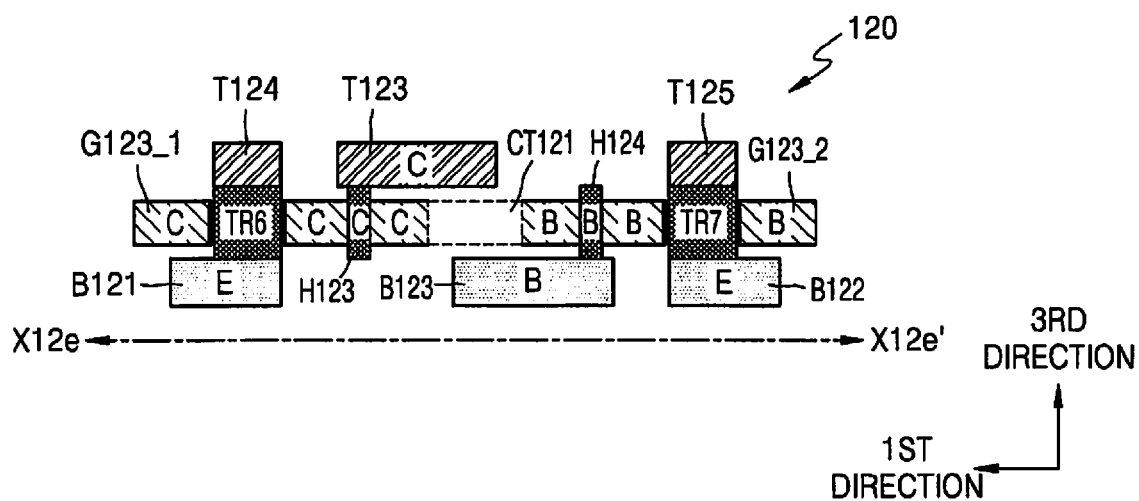

Similarly, as illustrated in FIG. 12E, the partial gate line G123_1 of the third gate line G123 and the third top active region T123 may be electrically connected to each other through a third channel region H123, and a bottom active region under the third channel region H123 may be removed to limit and/or prevent unnecessary electrical connection with the bottom active region. In addition, the partial gate line G123_2 of the third gate line G123 and the third bottom active region B123 may be electrically connected to each other through a fourth channel region H124, and a top active region on the fourth channel region H124 may be removed to limit and/or prevent unnecessary electrical connection with the top active region.

Figure 13A:
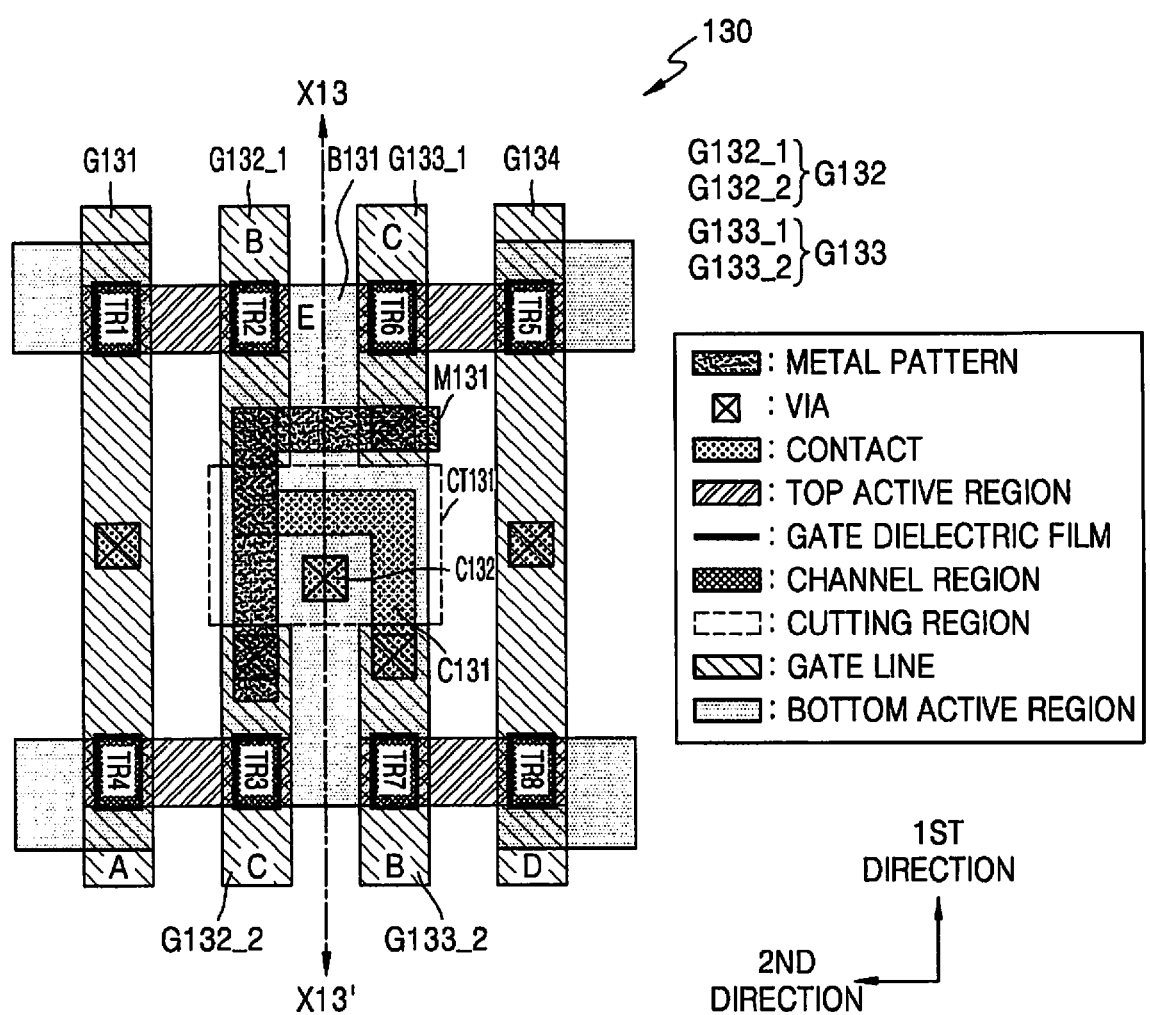
FIG. 13A is a plan view of a layout of an integrated circuit having a vertical transistor, according to some example embodiments of inventive concepts.
Figure 13B:
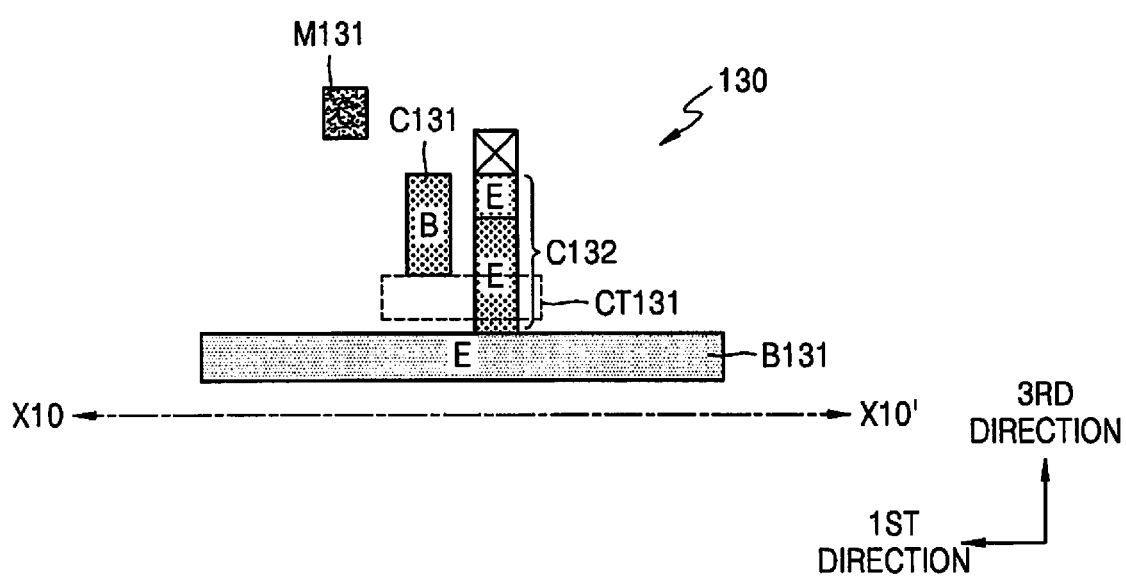
FIG. 13B is a cross-sectional view of the layout of FIG. 13A taken along line X13-X13'.

FIG. 13A is a plan view of a layout of an integrated circuit 130 having a vertical transistor, according to some example embodiments of inventive concepts, and FIG. 13B is a cross-sectional view of the layout of the integrated circuit 130 of FIG. 13A taken along line X13-X13'.

Referring to FIG. 13A, the layout of the integrated circuit 130 may include first through fourth gate lines G131 through G134 extending in parallel in a first direction and the first through fourth gate lines G131 through G134 may form the transistors TR1 through TR8 in a region vertically overlapping top and bottom active regions (e.g., in a third direction of FIG. 13B) by a gate dielectric layer and a channel region. The layout of the integrated circuit 130 of FIG. 13A may include a first cutting region CT131 for separating the second and third gate lines G132 and G133 from each other similarly to the layout of the integrated circuit 70 of FIGS. 7A and 7B, wherein a first directional length of the first cutting region CT131 in FIG. 13A may be equal to or greater than that of the first cutting region CT71 of FIG. 7A. For example, the first cutting region CT131 may divide (or remove) a part of the second gate line G132 and a part of the third gate lines G133 such that the second gate line G132 and the third gate line G133 do not extend into the first cutting region CT131.

According to some example embodiments of inventive concepts, a contact contacting a bottom active region may be disposed in a cutting region disposed to form a cross-coupled structure, e.g., a region between a region including partial gate lines G132_1 and G133_1 and a region including partial gate lines G132_2 and G133_2. That is, a cutting region may be used for electrical connection between a bottom active region and a via as well as insulation of gate lines for a cross-coupled structure. For example, as illustrated in FIG. 13A, the second gate line G132 may be divided into the two partial gate lines G132_1 and G132_2 by the first cutting region CT131, and the third gate line G133 may be divided into the two partial gate lines G133_1 and G133_2 by the first cutting region CT131. A first bottom active region B131 shared by the transistors TR2, TR3, TR6, and TR7 formed by the partial gate lines G132_1, G132_2, G133_1 and G133_2 may be electrically connected to the via through a second contact C132, and as illustrated in FIG. 13B, the second contact C132 may vertically penetrate the first cutting region CT131 (e.g., in the third direction).

Figure 14A:
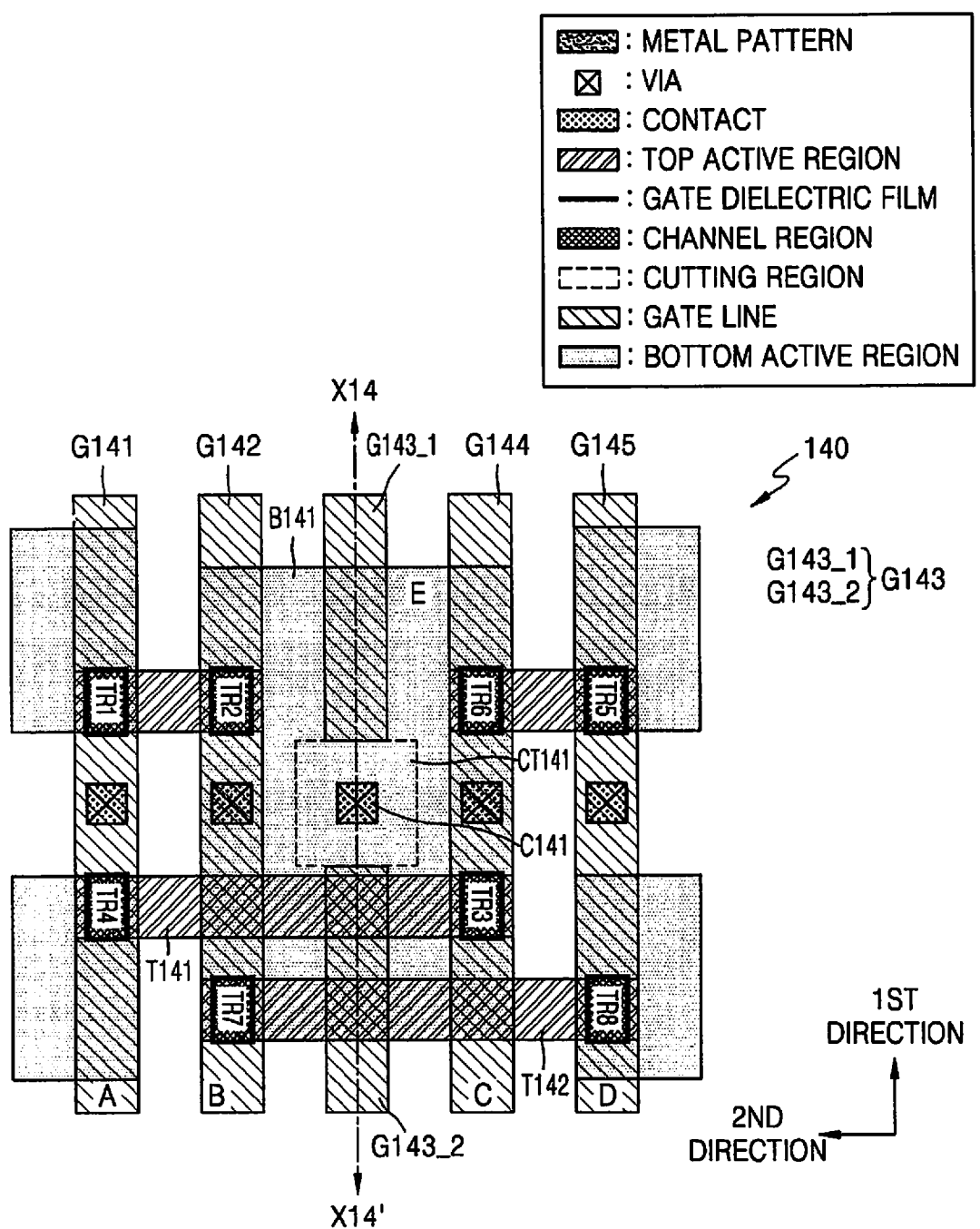
FIG. 14A is a plan view of a layout of an integrated circuit having a vertical transistor; according to some example embodiments of inventive concepts.
Figure 14B:
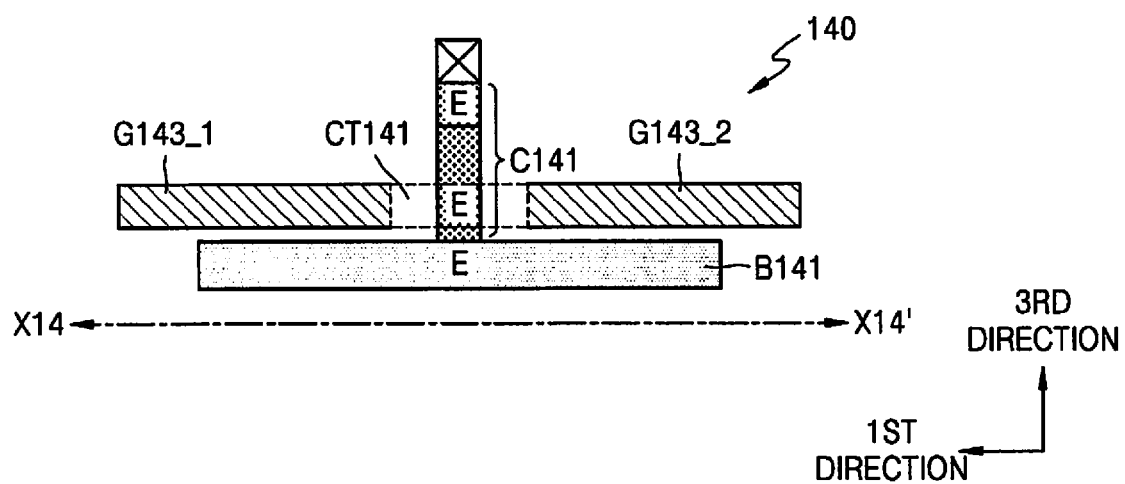
FIG. 14B is a cross-sectional view of the layout of FIG. 14A taken along line X14-X14'.

FIG. 14A is a plan view of a layout of an integrated circuit 140 having a vertical transistor, according to some example embodiments of inventive concepts, and FIG. 14B is a cross-sectional view of the layout of the integrated circuit 140 of FIG. 14A taken along line X14-X14'.

Referring to FIG. 14A, the layout of the integrated circuit 140 may include first through fifth gate lines G141 through G145 extending in parallel in a first direction and the first, second, fourth, and fifth gate lines G141, G142, G144, and G145 may form the transistors TR1 through TR8 in a region vertically overlapping top and bottom active regions (e.g., in a third direction of FIG. 14B) by a gate dielectric layer and a channel region. A third gate line G143 may be disposed between the second and fourth gate lines G142 and G144 forming a transistor as a dummy gate line. Similar to the layout of the integrated circuit 40 of FIG. 4A, the layout of the integrated circuit 140 of FIG. 14A may form a cross-coupled structure by a first top active region T141 across the second gate line G142 and a second top active region T141 across the fourth gate line G144.

According to some example embodiments of inventive concepts, a cutting region that removes a part of a dummy gate line may be disposed, and a bottom active region may be electrically connected to a via through a contact penetrating the cutting region. For example, as illustrated in FIG. 14A, the third gate line G143 which is a dummy gate line may be divided into partial gate lines G143_1 and G143_2 by a first cutting region CT141. Referring to FIG. 14B, a first contact C141 may be on a first bottom active region B141, and may electrically connect the first bottom active region B141 to the via by vertically penetrating the first cutting region CT141 (e.g., in the third direction). The integrated circuit 140 includes a second top active region T142.

Figure 15A:
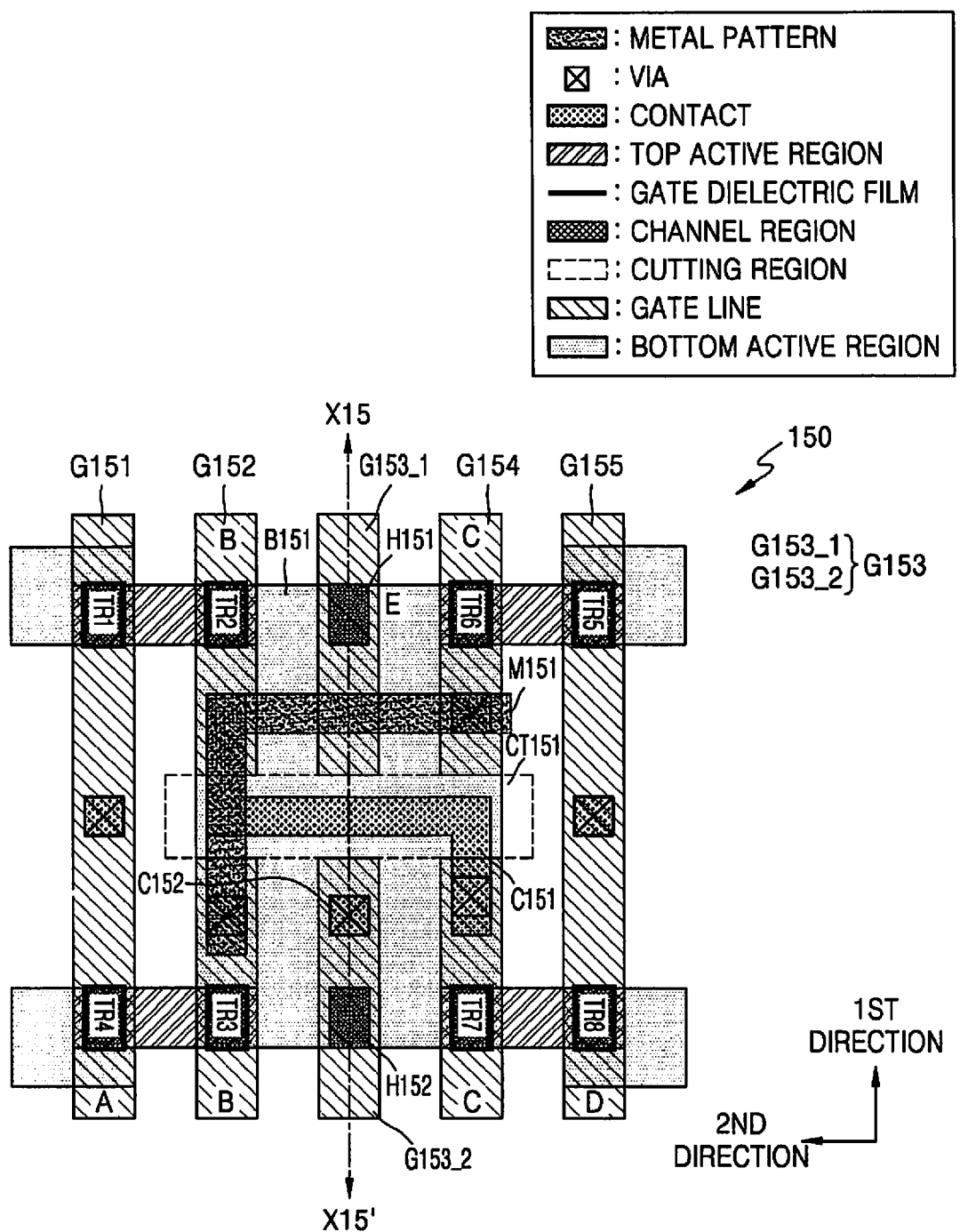
FIG. 15A is a plan view of a layout of an integrated circuit having a vertical transistor, according to some example embodiments of inventive concepts.
Figure 15B:
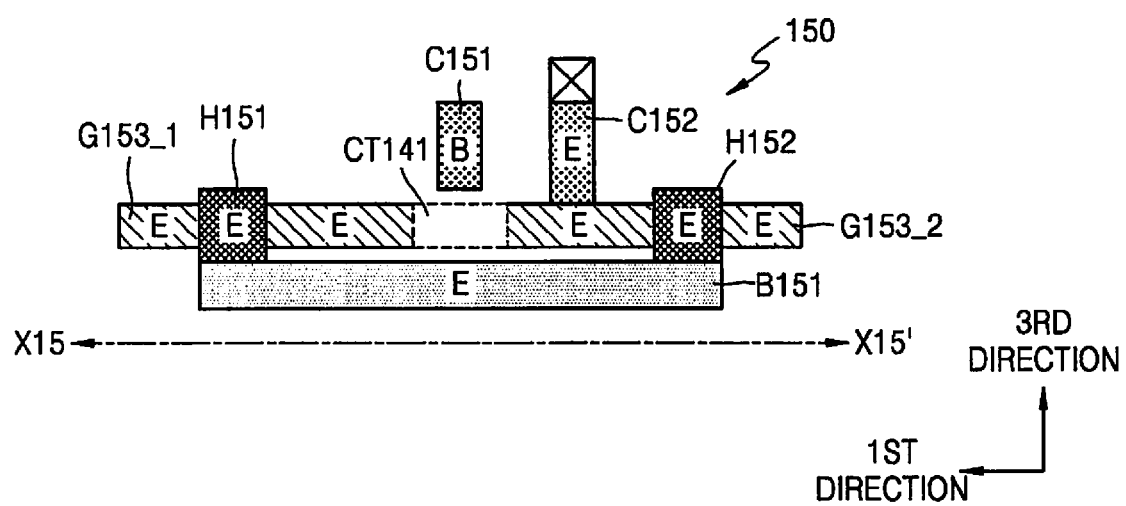
FIG. 15B is a cross-sectional view of the layout of FIG. 15A taken along line X15-X15'.

FIG. 15A is a plan view of a layout of an integrated circuit 150 having a vertical transistor, according to some example embodiments of inventive concepts, and FIG. 15B is a cross-sectional view of the layout of the integrated circuit 150 of FIG. 15A taken along line X15-X15'.

Referring to FIG. 15A, the layout of the integrated circuit 150 may include first through fifth gate lines G151 through G155 extending in parallel in a first direction and the first, second, fourth, and fifth gate lines G151, G152, G154, and G155 may form the transistors TR1 through TR8 in a region vertically overlapping top and bottom active regions (e.g., in a third direction of FIG. 15B) by a gate dielectric layer and a channel region. A third gate line G153 may be disposed between the second and fourth gate lines G152 and G154 forming a transistor as a dummy gate line. The layout of the integrated circuit 150 of FIG. 15A may include a first cutting region CT151 for separating the second through fourth gate lines G152 through G154 from each other similarly to the layout of the integrated circuit 70 of FIGS. 7A and 7B. The first cutting region CT151 may divide (or remove) a part of the second through fourth gate lines G152 through G154 such that the second through fourth gate lines G152 through G154 do not extend into the first cutting region CT151.

According to some example embodiments of inventive concepts, in order to electrically connect a bottom active region to a via, a channel region penetrating a dummy gate line may be used and a contact electrically connecting the dummy gate line to the via may be used. For example, as illustrated in FIGS. 15A and 15B, the third gate line G153 which is a dummy gate line may be divided into partial gate lines G153_1 and G153_2 by the first cutting region CT151, and first and second channel regions H151 and H152 respectively penetrating the partial gate lines G153_1 and G153_2 of the third gate line G153 may be over the first bottom active region B151. As described above with reference to FIG. 12B and the like, a gate dielectric layer between the first and second channel regions H151 and H152 and the partial gate lines G153_1 and G153_2 of the third gate line G153 may be removed. Thus, the first bottom active region B151 and the partial gate lines G153_1 and G153_2 of the third gate line G153 may have an identical potential. As a result, as illustrated in FIGS. 15A and 15B, the first bottom active region B151 may be electrically connected to the via by a contact electrically connecting gate lines to the via, that is, a second contact C152. Thus, a layout of a cross-coupled structure may be implemented by using a dummy gate line without waste of area for electrically connecting the first bottom active region B151 to the via.

Figure 16A:
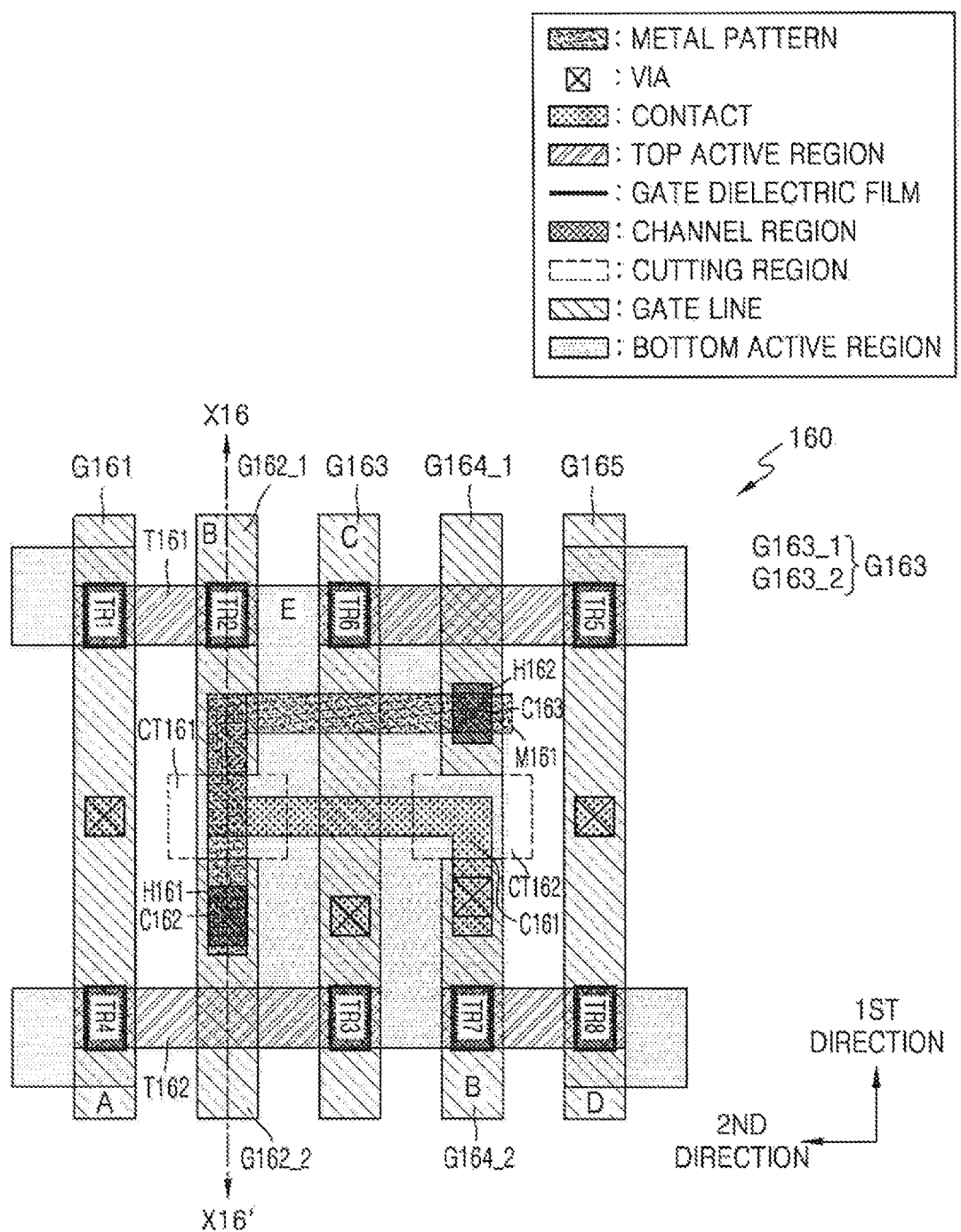
FIG. 16A is a plan view of a layout of an integrated circuit having a vertical transistor, according to some example embodiments of inventive concepts.
Figure 16B:
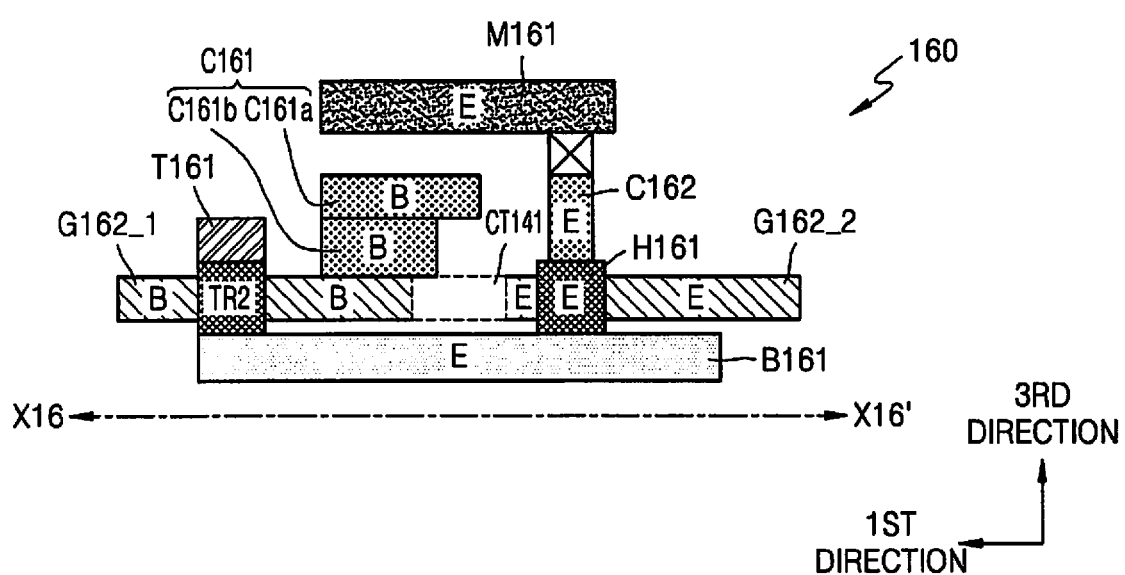
FIG. 16B is a cross-sectional view of the layout of FIG. 16A taken along line X16-X16'.

FIG. 16A is a plan view of a layout of an integrated circuit 160 having a vertical transistor, according to some example embodiments of inventive concepts, and FIG. 16B is a cross-sectional view of the layout of the integrated circuit 160 of FIG. 16A taken along line X16-X16'.

Referring to FIG. 16A, the layout of the integrated circuit 160 may include first through fifth gate lines G161 through G165 extending in parallel in a first direction and the first through fifth gate lines G161 through G165 may form the transistors TR1 through TR8 in a region vertically overlapping top and bottom active regions (e.g., in a third direction of FIG. 16B) by a gate dielectric layer and a channel region. In the layout 160 of the integrated circuit 160 of FIG. 16A, the second and fourth gate lines G162 and G164 may each form only one transistor and may be separated from each other by the first and second cut regions CT161 and CT162, respectively.

Different from the layouts of the integrated circuits illustrated in FIGS. 7A and 7B and the like, a cross-coupled structure may be implemented by interconnection across one gate line. For example, as illustrated in FIG. 16A, the third and sixth transistors TR3 and TR6 connected to the node C may include the third gate line G163 which is not cut, and the second and seventh transistors TR2 and TR7 connected to the node B may include the second and fourth gate lines G162 and G164, respectively. The second and fourth gate lines G162 and G164 may be separated into the partial gate lines G162_1, G162_2, G164_1, and G164_2 by the first and second cutting regions CT161 and CT162, and the partial gate line G162_1 of the second gate line G162 forming the second transistor TR2 and the partial gate line G164_2 of the fourth gate line G164 forming the seventh transistor TR7 may be electrically connected to a first contact C161. Thus, the partial gate lines G162_2 and G164_1, which are dummy gate lines, may be generated. The integrated circuit 160 includes a first top active region T161 and a second top active region T162.

Similar to the layout of the integrated circuit 150 of FIGS. 15A and 15B, a channel region penetrating a dummy gate line may be used to electrically connect a bottom active region to a via. Furthermore, a contact that electrically connects the channel region to the via may also be used. For example, as illustrated in FIGS. 16A and 16B, a first channel region H161 penetrating the partial gate line G162_2, which is a dummy gate line, may be disposed to contact on a first bottom active region B161. A second contact C162 may be over the first channel region H161 so that the first bottom active region B161 may be electrically connected to the via through the first channel region H161 and the second contact C162. Thus, a layout of a cross-coupled structure may be implemented by using a dummy gate line without waste of area for electrically connecting the first bottom active region B161 to the via.

Figure 17:
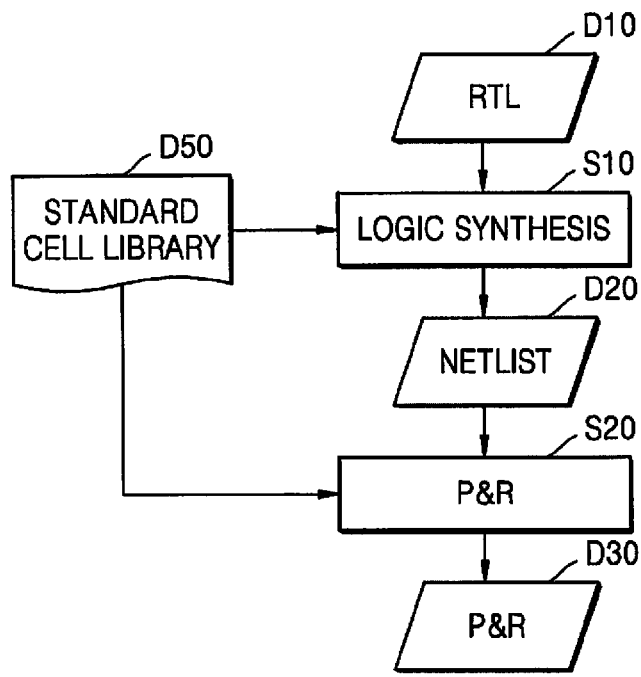
FIG. 17 is a flowchart of a method of designing a layout of an integrated circuit having a vertical transistor, according to some example embodiments of inventive concepts.

FIG. 17 is a flowchart of a method of designing a layout of an integrated circuit having a vertical transistor, according to some example embodiments of inventive concepts. As illustrated in FIG. 17, a standard cell library D50 may include information about a plurality of standard cells, such as function information, characteristic information, layout information, and the like, and a layout of the standard cells may include a cross-coupled structure according to the above-described some example embodiments of inventive concepts.

Referring to FIG. 17, in operation S10, a logic synthesis operation for generating netlist data D20 from RTL data D10 may be performed. For example, a semiconductor design tool (for example, a logic synthesis tool) may be used to generate the netlist data D20 including a bitstream or netlist, from the RTL data D10 written in a VHDL and an HDL like Verilog, by performing the logic synthesis operation with reference to the standard cell library D50. According to some example embodiments of inventive concepts, the semiconductor design tool, with reference to the standard cell library D50 including characteristic information of standard cells including a vertical transistor in a logic synthesis process, may select standard cells including a vertical transistor and include an instance of the standard cells in an integrated circuit.

In operation S20, a place and routing (P&R) operation for generating layout data D30 from the netlist data D20 may be performed. For example, the semiconductor design tool (for example, a P&R tool) may be used to generate the layout data D30 having a format like GDSII, from the netlist data D20, by placing and routing a plurality of standard cells with reference to the standard cell library D50. According to some example embodiments of inventive concepts, the semiconductor design tool may place and route a standard cell including a vertical transistor and a standard cell including a cross-coupled structure as a standard cell. Accordingly, the semiconductor design tool may be used to perform a routing operation with a high degree of freedom. As a result, performance of an integrated circuit according to a layout generated by using the semiconductor design tool may be improved.

Figure 18:
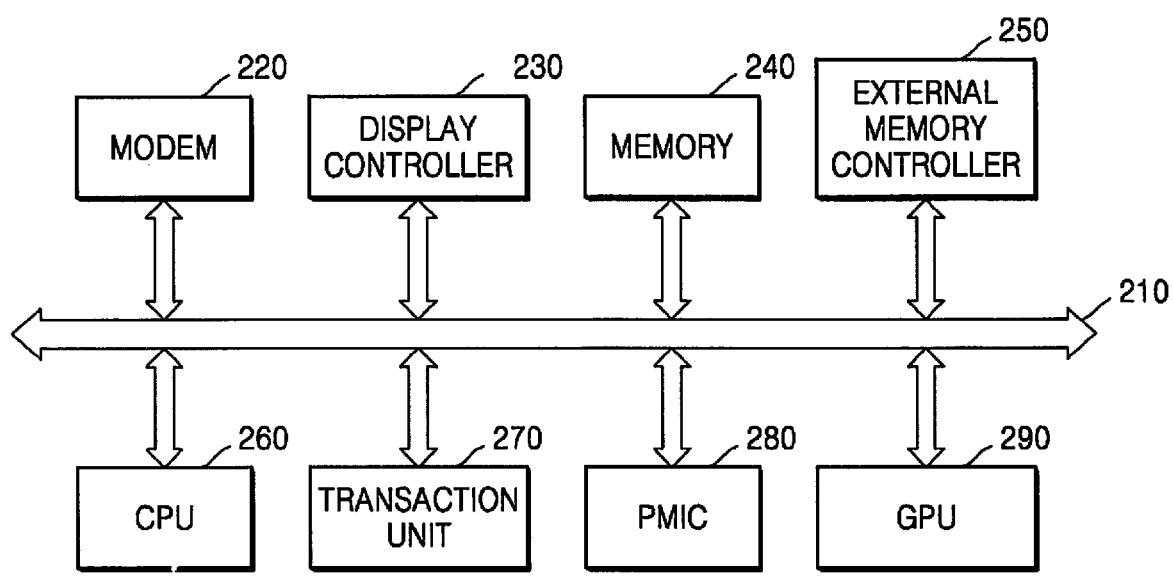
FIG. 18 is a block diagram of a system-on-chip (SoC) according to some example embodiments of inventive concepts.

FIG. 18 is a block diagram of a system-on-chip (SoC) 200 according to some example embodiments of inventive concepts. The SoC 200, which is a semiconductor device, may include an integrated circuit according to some example embodiments of inventive concepts. The SoC 200 implements complicated function blocks (for example, intellectual property (IP)) exhibiting various functions therein. A layout of a cross-coupled structure including a vertical transistor according to some example embodiments of inventive concepts may be included in each of the function blocks of the SoC 200, and thus, performance of the SoC 200 may be improved.

Referring to FIG. 18, the SoC 200 may include a modem 220, a display controller 230, a memory 240, an external memory controller 250, a central processing unit (CPU) 260, a transaction unit 270, a power management integrated circuit (PMIC) 280, and a graphics processing unit (GPU) 290, and the function blocks of the SoC 200 may communicate with each other via a system bus 210.

The CPU 260 generally controlling operations of the SoC 200 may control operations of the other function blocks 220, 230, 240, 250, 270, 280, and 290. The modem 220 may demodulate a signal received from outside the SoC 200, or may modulate a signal generated in the SoC 200 and transmit the signal outside. The external memory controller 250 may control transmitting and receiving operations of data to/from an external memory device connected to the SoC 200. For example, a program and/or data stored in the external memory device may be provided to the CPU 260 or GPU 290 under the control of the external memory controller 250. The GPU 290 may execute program instructions related to graphics processing. The GPU 290 may receive graphic data through the external memory controller 250, and may also transmit the graphic data processed by the GPU 290 outside the SoC 200 through the external memory controller 250. The transaction unit 270 may monitor data transaction of each of the function blocks, and the PMIC 280 may control power supplied to each of the function blocks according to control of the transaction unit 270. The display controller 230 may control a display (or a display device) outside the SoC 200 and may transmit data generated in the SoC 200 to the display.

The memory 240 may include, as a nonvolatile memory, an electrically erasable programmable read-only memory (EEPROM), a flash memory, a phase change random access memory (PRAM), a resistive random access memory (RRAM), a nano-floating gate memory (NFGM), a polymer random access memory (PoRAM), a magnetic random access memory (MRAM), or a ferroelectric random access memory (FRAM), and may include, as a volatile memory, a dynamic random access memory (DRAM), a static RAM (SRAM), a mobile DRAM, a double data rate synchronous DRAM (DDR SDRAM), a low power DDR (LPDDR), a graphic DDR (GDDR) SDRAM, or a rambus DRAM (RDRAM).

While some example embodiments of inventive concepts have been described, it will be understood that various changes in form and details may be made therein without departing from the spirit and scope of the following claims.

What is claimed is:

1. An integrated circuit having a vertical transistor, the integrated circuit comprising:
   a first gate line, a second gate line, a third gate line, and a fourth gate line extending in a first direction and sequentially arranged in parallel with each other;
   a first top source/drain region over the first gate line through the third gate line and insulated from the second gate line, the first top source/drain region forming a first transistor with the first gate line and a first channel region, and forming a third transistor with the third gate line and a third channel region; and
   a second top source/drain region over the second gate line through the fourth gate line, the second top source/drain region being insulated from the third gate line, the second top source/drain region forming a second transistor with the second gate line and a second channel region, and forming a fourth transistor with the fourth gate line and a fourth channel region; and
   a first bottom source/drain region, the second transistor and the third transistor sharing the first bottom source/drain region.

2. The integrated circuit of claim 1, further comprising:
   a third top source/drain region forming a fifth transistor with the second gate line and a fifth channel region; and
   a fourth top source/drain region forming a sixth transistor with the third gate line and a sixth channel region, wherein
   the fifth transistor and the sixth transistor share the first bottom source/drain region.

3. The integrated circuit of claim 1, further comprising:
   a first cutting region over the first bottom source/drain region, the first cutting region dividing a part of the second gate line and a part of the third gate line such that the second gate line and the third gate line do not extend into the first cutting region; and
   a contact configured to vertically penetrate the first cutting region and contact the first bottom source/drain region.

4. The integrated circuit of claim 1, further comprising:
   a fifth gate line extending in the first direction between the second gate line and the third gate line;
   a first cutting region over the first bottom source/drain region, the first cutting region dividing a part of the fifth gate line such that the fifth gate line does not extend into the first cutting region; and
   a contact configured to vertically penetrate the first cutting region and contact the first bottom source/drain region.

5. The integrated circuit of claim 1, further comprising:
a contact configured to contact the first bottom source/drain region between the second gate line and the third gate line.

6. The integrated circuit of claim 1, further comprising:
a third top source/drain region, the third top source/drain region forming a fifth transistor with the second gate line and a fifth channel region; and
a fourth top source/drain region, the fourth top source/drain region forming a sixth transistor with the third gate line and a sixth channel region;
a second bottom source/drain region shared by the fifth transistor and the sixth transistor; and
contacts configured to respectively contact the first bottom source/drain region and the second bottom source/drain region.

7. The integrated circuit of claim 1, further comprising:
a substrate, wherein
the first top source/drain region, the second top source/drain region, the first channel region, the second channel region, the third channel region, the fourth channel region, the first gate line, the second gate line, the third gate line, and the fourth gate line are on the substrate.

8. An integrated circuit having a vertical transistor, the integrated circuit comprising:
a first gate line, a second gate line, a third gate line, and a fourth gate line extending in a first direction and sequentially arranged in parallel with each other;
a first top source/drain region over the first gate line through the third gate line and insulated from the second gate line, the first top source/drain region forming a first transistor and a third transistor with the first gate line and the third gate line respectively; and
a second top source/drain region over the second gate line through the fourth gate line, the second top source/drain region being insulated from the third gate line, the second top source/drain region forming a second transistor and a fourth transistor with the second gate line and the fourth gate line respectively; and
at least one of a first contact or a second contact and a first bottom source/drain region,
the first contact being on a first portion of the second gate line and arranged so the first top source/drain region extends between the first contact and the second top source/drain region in a plan view,
the second contact being configured to contact the first bottom source/drain region between the second gate line and the third gate line.

9. The integrated circuit of claim 8, wherein the at least one of the first contact or the second contact and the first bottom source/drain region includes the second contact and the first bottom source/drain region.

10. The integrated circuit of claim 9, wherein the second contact is electrically connected to the first bottom source/drain region.

11. An integrated circuit having a vertical transistor, the integrated circuit comprising:
a first gate line, a second gate line, a third gate line, and a fourth gate line extending in a first direction and sequentially arranged in parallel with each other;
a first top source/drain region over the first gate line through the third gate line and insulated from the second gate line, the first top source/drain region forming a first transistor and a third transistor with the first gate line and the third gate line respectively;
a second top source/drain region over the second gate line through the fourth gate line, the second top source/drain region being insulated from the third gate line, the second top source/drain region forming a second transistor and a fourth transistor with the second gate line and the fourth gate line respectively; and
a first bottom source/drain region, the second transistor and the third transistor sharing the first bottom source/drain region;
a contact configured to contact the first bottom source/drain region between the second gate line and the third gate line, wherein
the contact is electrically connected to the first bottom source/drain region.

* * * * *